(12) United States Patent
Kakoiyama et al.

(10) Patent No.: US 12,140,750 B2
(45) Date of Patent: Nov. 12, 2024

(54) LIGHT REFLECTING ELEMENT AND SPATIAL LIGHT MODULATOR

(71) Applicant: SONY SEMICONDUCTOR SOLUTIONS CORPORATION, Kanagawa (JP)

(72) Inventors: Naoki Kakoiyama, Kanagawa (JP); Shusaku Yanagawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 627 days.

(21) Appl. No.: 17/419,229

(22) PCT Filed: Dec. 6, 2019

(86) PCT No.: PCT/JP2019/047870
§ 371 (c)(1),
(2) Date: Jun. 28, 2021

(87) PCT Pub. No.: WO2020/144991
PCT Pub. Date: Jul. 16, 2020

(65) Prior Publication Data
US 2022/0057624 A1 Feb. 24, 2022

(30) Foreign Application Priority Data
Jan. 8, 2019 (JP) .................................. 2019-001113

(51) Int. Cl.
*G02B 26/08* (2006.01)
(52) U.S. Cl.
CPC ................................ *G02B 26/0816* (2013.01)
(58) Field of Classification Search
CPC ............ G02B 26/0816; G02B 26/0841; B81B 2201/042; B81B 3/0072; G03B 21/008; B81C 2201/0167
See application file for complete search history.

(56) References Cited

U.S. PATENT DOCUMENTS

| 6,862,127 B1 | 3/2005 | Ishii |
| 2006/0050353 A1 | 3/2006 | Huibers et al. |

(Continued)

FOREIGN PATENT DOCUMENTS

| CN | 101029965 A | 9/2007 |
| CN | 101258101 A | 9/2008 |

(Continued)

OTHER PUBLICATIONS

International Search Report and Written Opinion of PCT Application No. PCT/JP2019/047870, issued on Jan. 28, 2020, 11 pages of ISRWO.

*Primary Examiner* — Euncha P Cherry
(74) *Attorney, Agent, or Firm* — CHIP LAW GROUP

(57) ABSTRACT

A light reflecting element includes a support part 21, a hinge part 30, and a light reflecting part 40, in which the light reflecting part 40 includes a support layer and a light reflecting layer 50, the hinge part 30 includes a torsion bar portion 31, extending portions 34A and 34B extending from sides of the torsion bar portion 31, and movable pieces 35A and 35B extending from ends of the extending portions 34A and 34B, an end of the torsion bar portion 31 is fixed to the support part 21, the hinge part 30 is capable of being twisted and deformed around an axis of the torsion bar portion 31, the support layer is fixed to the movable pieces 35A and 35B, a recess 41D is provided at least in a portion of the support layer facing a space 35D located between the first movable piece 35A and the second movable piece 35B, and a stress adjusting layer 91 is provided on the support layer in parallel to the light reflecting layer 50 and separated from the light reflecting layer 50.

20 Claims, 27 Drawing Sheets

(56) References Cited

U.S. PATENT DOCUMENTS

| | | |
|---|---|---|
| 2006/0126152 A1 | 6/2006 | Pan |
| 2007/0121192 A1 | 5/2007 | Lee et al. |
| 2007/0134896 A1* | 6/2007 | Lee .................... B81C 1/00182 |
| | | 438/551 |
| 2018/0217303 A1* | 8/2018 | Kawaji .................. C23C 14/30 |

FOREIGN PATENT DOCUMENTS

| | | |
|---|---|---|
| CN | 101282903 A | 10/2008 |
| EP | 1793260 A1 | 6/2007 |
| JP | 2005-279831 A | 10/2005 |
| JP | 2007-514183 A | 5/2007 |
| JP | 2007-156466 A | 6/2007 |
| JP | 2009-505162 A | 2/2009 |
| JP | 2010-210782 A | 9/2010 |
| JP | 2017-068213 A | 4/2017 |
| KR | 10-2008-0055851 A | 6/2008 |
| WO | 2005/045505 A1 | 5/2005 |
| WO | 2007/022476 A1 | 2/2007 |

\* cited by examiner

LIGHT REFLECTING ELEMENT AND SPATIAL LIGHT MODULATOR

CROSS REFERENCE TO RELATED APPLICATIONS

This application is a U.S. National Phase of International Patent Application No. PCT/JP2019/047870 filed Dec. 6, 2019, which claims priority benefit of Japanese Patent Application No. JP 2019-001113 filed in the Japan Patent Office on Jan. 8, 2019. Each of the above-referenced applications is hereby incorporated herein by reference in its entirety.

TECHNICAL FIELD

The present disclosure relates to a light reflecting element and a spatial light modulator including a plurality of such light reflecting elements.

BACKGROUND ART

A spatial light modulator including a plurality of light reflecting elements is often used as a projector or an image display device. For example, the light reflecting element disclosed in US Patent Publication US2006/0050353A1 includes:
a post provided on a substrate;
a band-shaped hinge with both ends fixed to the post;
a hinge contact with one end attached to a center of the hinge; and
a mirror plate attached to the other end of the hinge contact,
in which a trench is formed in a portion (light reflecting surface) of the mirror plate that faces the hinge, and
a light is incident on the mirror plate of the light reflecting element via the substrate, and a light reflected by the mirror plate is emitted to the outside through the substrate.

CITATION LIST

Patent Document

Patent Document 1: US Patent Publication US2006/0050353A1

SUMMARY OF THE INVENTION

Problems to be Solved by the Invention

Now, in the light reflecting element disclosed in the above-described US Patent Publication, since the trench is formed in the central portion of the light reflecting surface of the mirror plate, rigidity of the entire mirror plate is low and the mirror plate is likely to warp due to thermal stress, and the area of the light reflecting surface of the mirror plate is reduced by the area of the trench. Thus, there is a problem that light reflection efficiency and contrast of the light reflecting element decrease.

Therefore, an object of the present disclosure is to provide a light reflecting element having a configuration and a structure that are difficult to warp and capable of making the area of the light reflecting surface as large as possible, and a spatial light modulator having a plurality of such light reflecting elements.

Solutions to Problems

A light reflecting element of the present disclosure for achieving the object described above includes a support part provided on a substrate, and a hinge part and a light reflecting part,
in which the light reflecting part includes a support layer and a light reflecting layer formed on the support layer,
the hinge part includes a torsion bar portion, a first extending portion extending from a part of one side of the torsion bar portion, a first movable piece extending from an end of the first extending portion, a second extending portion extending from a part of the other side of the torsion bar portion, and a second movable piece extending from an end of the second extending portion,
an end of the torsion bar portion is fixed to the support part,
the hinge part is capable of being twisted and deformed around an axis of the torsion bar portion,
the support layer is formed from above the first movable piece to above the second movable piece,
a recess is provided at least in a portion of the support layer facing a space located between the first movable piece and the second movable piece, and
a stress adjusting layer is provided on the support layer in parallel to the light reflecting layer and separated from the light reflecting layer.

A spatial light modulator of the present disclosure for achieving the above-described object is a spatial light modulator in which light reflecting elements are arranged in an array,
in which each of the light reflecting elements includes the light reflecting element of the present disclosure.

MODE FOR CARRYING OUT THE INVENTION

Figure 1A:
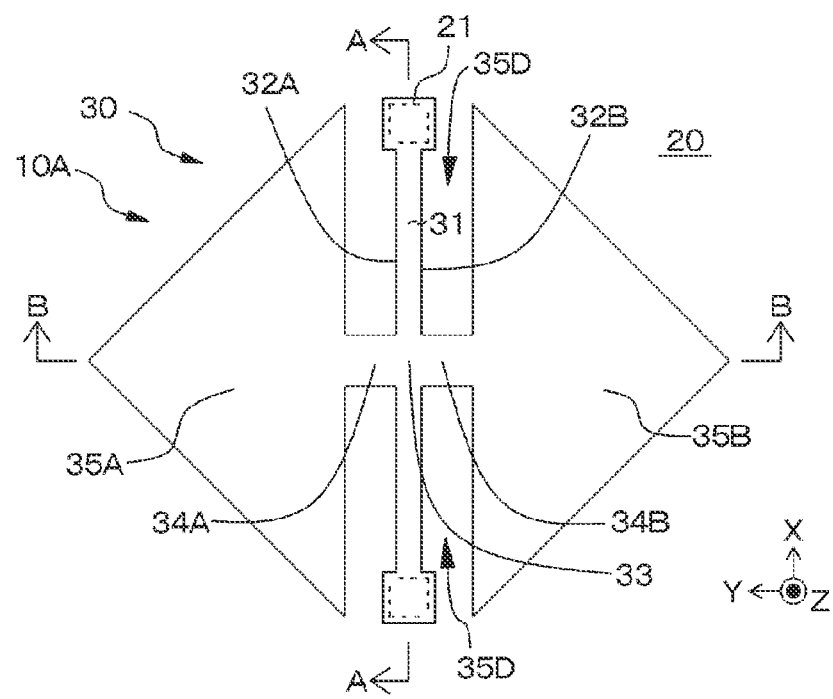
FIGS. 1A and 1B are a schematic plan view of a support part and a hinge part constituting a light reflecting element of Example 1 and a schematic plan view of a lower support layer, respectively.

Hereinafter, the present disclosure will be described on the basis of examples with reference to the drawings, but the present disclosure is not limited to the examples, and various numerical values and materials in the examples are examples. Note that the description will be made in the following order.

1. Description of light reflecting element and spatial light modulator of present disclosure in general
2. Example 1 (light reflecting element and spatial light modulator of present disclosure)
3. Example 2 (modification of Example 1)
4. Example 3 (another modification of Example 1)
5. Example 4 (modification of Examples 1 to 3)
6. Example 5 (modification of Examples 1 to 4)
7. Others <Description of Light Reflecting Element and Spatial Light Modulator of Present Disclosure in General>

A light reflecting element of the present disclosure and a light reflecting element provided in a spatial light modulator of the present disclosure (hereinafter, these light reflecting elements are collectively referred to as a "light reflecting element and the like of the present disclosure") can have a configuration, in which a support layer has a two-layer structure of a lower support layer and an upper support layer, the lower support layer includes a first lower support layer, a second lower support layer, and a third lower support layer, the first lower support layer is formed above a first movable piece, the second lower support layer is formed above a second movable piece, the third lower support layer is formed above a first extending portion, above a second extending portion, and above a part of a torsion bar portion located between the first extending portion and the second extending portion, and the upper support layer is formed on and from the first lower support layer to the second lower support layer including the third lower support layer. Note that the light reflecting element and so on of the present disclosure having such a configuration is referred to as a "light reflecting element having a first configuration" for convenience.

The light reflecting element having the first configuration can have a configuration in which the upper support layer is formed on the first lower support layer, the third lower support layer, and the second lower support layer, and above a space (recess) surrounded by the first lower support layer, the second lower support layer, and the third lower support layer.

Alternatively, the light reflecting element and the like of the present disclosure can have a configuration in which the support layer has a two-layer structure of a lower support layer and an upper support layer, the lower support layer includes a first lower support layer and a second lower support layer, the first lower support layer is formed above the first movable piece, the second lower support layer is formed above the second movable piece, and the lower support layer is not formed on the first extending portion, the second extending portion, and a part of the torsion bar portion located between the first extending portion and the second extending portion. Note that the light reflecting element and the like of the present disclosure having such a configuration is referred to as a "light reflecting element having a second configuration" for convenience.

The light reflecting element having the first configuration can have a configuration in which a space (second recess) existing above the first extending portion, the second extending portion, and the part of the torsion bar portion located between the first extending portion and the second extending portion communicates with the recess.

Alternatively, the light reflecting element and the like of the present disclosure can have a configuration in which, the support layer has a two-layer structure of a lower support layer and an upper support layer, the lower support layer includes a first A lower support layer, a first B lower support layer, and a first C lower support layer, a second A lower support layer, a second B lower support layer, and a second C lower support layer, and a third lower support layer, the first A lower support layer is formed above the first movable piece, the first B lower support layer and the first C lower support layer are formed above the first movable piece separately from a side of the first A lower support layer and across the first A lower support layer, the second A lower support layer is formed above the second movable piece, the second B lower support layer and the second C lower support layer are formed above the second movable piece separately from a side of the second A lower support layer and across the second A lower support layer, the first extending portion, the second extending portion, and a part of the torsion bar portion located between the first extending portion and the second extending portion are located between the first A lower support layer and the second A lower support layer, the third lower support layer is formed above the first extending portion, above the second extending portion, and above the part of the torsion bar portion located between the first extending portion and the second extending portion, and the upper support layer is formed on and from the first lower support layer to the second lower support layer including the third lower support layer. Note that the light reflecting element and the like of the present disclosure having such a configuration is referred to as a "light reflecting element having a third configuration" for convenience.

The light reflecting element having the third configuration can have a configuration in which the upper support layer is formed on the third lower support layer, and is formed on the first B lower support layer to the first C lower support layer, and is formed on the second B lower support layer to the second C lower support layer, and is formed above a space (recess) surrounded by the first B lower support layer, the second B lower support layer, and the third lower support layer, and is formed above a space (recess) surrounded by the first C lower support layer, the second C lower support layer, and the third lower support layer.

The light reflecting element and the like of the present disclosure including the various preferable configurations described above can have a form in which, the recess is provided on a surface of a side of the substrate of the support layer (surface opposite to the surface on which the light reflecting layer is provided).

Moreover, the light reflecting element and the like of the present disclosure including the various preferable configurations and forms described above can have a form in which the stress adjusting layer is provided from an exposed surface of a lower surface of an upper support layer facing the substrate to a lower surface of a lower support layer facing the substrate, or the stress adjusting layer is provided from an exposed surface of a lower surface of an upper support layer facing the substrate to an interface between a lower support layer and the upper support layer, or the stress adjusting layer is provided inside an upper support layer. Note that although the stress adjusting layer is provided parallel to the light reflecting layer, it is not necessary that all areas of the stress adjusting layer are provided parallel to the light reflecting layer. That is, a form can be employed in which a part of the stress adjusting layer may be provided in parallel to the light reflecting layer.

Moreover, the light reflecting element and the like of the present disclosure including the various preferable configurations and forms described above can have a form in which a material forming at least a part of the light reflecting layer and a material forming at least a part of the stress adjusting layer are same, and in this case, a material forming the light reflecting layer and a material forming the stress adjusting layer are preferably same. Thus, in manufacturing of the light reflecting element, it is only necessary to add formation of the stress adjusting layer formed by the same material as the light reflecting layer, it is not necessary to newly introduce equipment, and the manufacturing cost can be reduced.

Moreover, the light reflecting element and the like of the present disclosure including the various preferable configurations and forms described above can have a form in which a thickness of the light reflecting layer and a thickness of the stress adjusting layer are same. Here, "thicknesses are same" means that values of designed thicknesses are the same, and includes thickness variations generated in manufacturing.

Moreover, the light reflecting element and the like of the present disclosure including the various preferable configurations and forms described above can have a form in which a configuration of the light reflecting layer and a configuration of the stress adjusting layer are symmetrical with respect to a layer existing between the light reflecting layer and the stress adjusting layer.

Moreover, the light reflecting element and the like of the present disclosure including the various preferable configurations and forms described above can have a form in which when a surface of the substrate is an XY plane, and when a stress at a maximum temperature specification value is $\sigma_{11}$ and a stress at a minimum temperature specification value is $\sigma_{12}$ among stresses generated in a plane parallel to the XY plane of the light reflecting layer, and a stress at a maximum temperature specification value is $\sigma_{21}$ and a stress at a minimum temperature specification value is $\sigma_{22}$ among stresses generated in a plane parallel to the XY plane of the stress adjusting layer, a sign of $\sigma_{11}$ and a sign of $\sigma_{21}$ are same, and a sign of $\sigma_{12}$ and a sign of $\sigma_{22}$ are same.

Moreover, the light reflecting element and the like of the present disclosure including the various preferable configurations and forms described above can have a form in which both ends of the torsion bar portion are fixed to the support part, or one end of the torsion bar portion is fixed to the support part.

Moreover, the light reflecting element and the like of the present disclosure including the various preferable configurations and forms described above can have a form in which the first extending portion and the second extending portion are arranged line-symmetrically with the axis of the torsion bar portion as an axis of symmetry, and the first movable piece and the second movable piece are arranged line-symmetrically with the axis of the torsion bar portion as an axis of symmetry.

Moreover, the light reflecting element and the like of the present disclosure including the various preferable configurations and forms described above can have a form in which the light reflecting part covers the support part, and thereby an area of the light reflecting layer can be increased, and a fill factor of the light reflecting layer can be increased.

Moreover, the light reflecting element and the like of the present disclosure including the various preferable configurations and forms described above can have a form in which an electrode for twisting and deforming the hinge part around the axis of the torsion bar portion is provided on a portion of the substrate facing each of the first movable piece and the second movable piece. That is, in a case where the light reflecting element is driven by torsional deformation of the hinge part, the electrode (drive electrode) is provided in a portion of the substrate located below the first movable piece and the second movable piece, and by electrostatic force generated between the hinge part (specifically, the first movable piece and the second movable piece) and the drive electrode by applying a voltage to the hinge part and the drive electrode, the hinge part may be driven (rotated) of the torsion bar portion may be twisted, or front ends of the movable pieces may be driven (moved up and down). A voltage is applied to the drive electrode, for example, from a drive circuit provided on the substrate, and a voltage is also applied to the hinge part, for example, from a drive circuit provided on the substrate.

Moreover, the light reflecting element and the like of the present disclosure including the various preferable configurations and forms described above can have a form in which a stopper is provided in an area of the substrate located below a front end of the movable piece. An insulating layer may be formed on a surface of the stopper, an antistatic layer may be formed so as not to be charged, or a close contact preventing layer may be formed to prevent the stopper and the movable piece from coming into close contact with each other when the stopper and the movable piece come into contact with each other.

The substrate can be formed by, for example, a silicon substrate, or can be formed by a silicon on insulator (SOI). A lower end of the support part is fixed to the substrate, but specifically, for example, the support part is only required to be formed on the substrate.

The support part is formed by a rigid body that basically does not expand and contract, and more specifically, can be formed by, for example, silicon, or amorphous silicon, or silicon oxide, or a combination of silicon and silicon oxide, SiN, or SiON. A cross-sectional shape of the support part when the support part is cut in a virtual plane perpendicular to the axis of the support part can be essentially any shape such as a circle, an ellipse, an oval, or a quadrangle including a square, a rectangle, a trapezoid, or the like. The number of support parts is two or one as described above.

The hinge part can be formed by, for example, a silicon layer or a silicon oxide layer, or a stacked structure of a silicon layer and a silicon oxide layer, or SiN, SiON, TiN, TiAl, AlN, TiSiN, or TiAlN. The support layer can also be formed by, for example, a silicon layer or an amorphous silicon layer, or a silicon oxide layer, or a stacked structure of a silicon layer and a silicon oxide layer.

The torsion bar portion is fixed to a back surface of an upper end portion of the support part, but specifically, the torsion bar portion is only required to be formed on the upper end portion of the support part. Alternatively, the support part and the torsion bar portion may be joined by, for example, a known joining technique (bonding technique). Here, as the bonding technology (bonding technique), not only a method of using an epoxy adhesive, an organic material such as benzo-cyclobutene (BCB) or CYTOP, glass frit, water glass, or the like as an adhesive layer, but also a method of using a solder layer or the like as an adhesive layer, an anode bonding method, a direct wafer bonding method including a method of treating a wafer surface with plasma of oxygen or the like, and a surface-activated room temperature bonding method can be mentioned.

The light reflecting layer constituting the light reflecting part can be formed by a metal film or an alloy film formed on a surface (front surface) of the support layer on the light incident side, and for example, can be formed by various physical vapor deposition methods (PVD methods) or various chemical vapor deposition methods (CVD methods). Specifically, examples of a material forming the light reflecting layer can include gold (Au), silver (Au), aluminum (Al), or alloys thereof.

Specifically, examples of a material forming the stress adjusting layer can also include gold (Au), silver (Au), aluminum (Al), or alloys thereof.

Outer shapes of the support layer can be essentially any shape such as a circle, an ellipse, an oval (a shape that combines a semicircle and two line segments), or a quadrangle including a square, a rectangle, a trapezoid, or the like. Furthermore, the outer shape of the light reflecting layer can also be essentially any shape such as a circle, an ellipse, an oval, or a quadrangle including a square, a rectangle, a trapezoid, or the like. The support layer and the light reflecting layer may have the same, similar, or analogous outer shapes, or may have different outer shapes. Moreover, the support layer and the light reflecting layer may have the same size, the support layer may be larger than the light reflecting layer, or the light reflecting layer may be larger than the support layer.

A light is incident on the light reflecting layer of the spatial light modulator from the outside, and a light is emitted from the light reflecting layer to the outside. By driving the hinge part, an emission direction of the light from the light reflecting layer to the outside can be controlled. Consequently, for example, an image can be displayed on an external screen, a display unit, or a display device, and for example, an application to a projection type display device (projector), a head mounted display (HMD), a spectroscopic device, and an exposure device is possible. The spatial light modulator can perform on and off controls of an incident light. Here, the on control refers to a state in which the incident light is emitted in a desired direction for displaying an image, and the off control refers to a state in which the incident light is emitted in another desired direction so as not to display the image.

Example 1

Figure 1B:
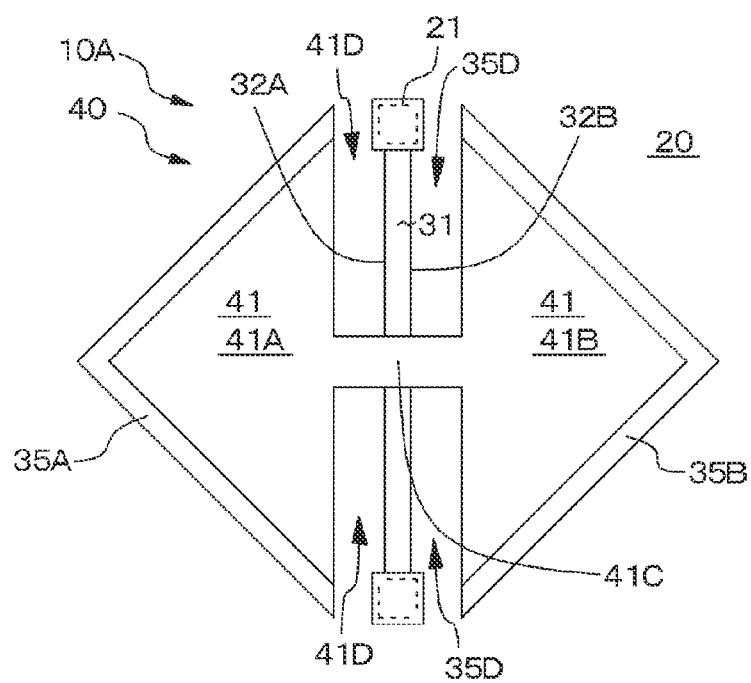
Figure 2:
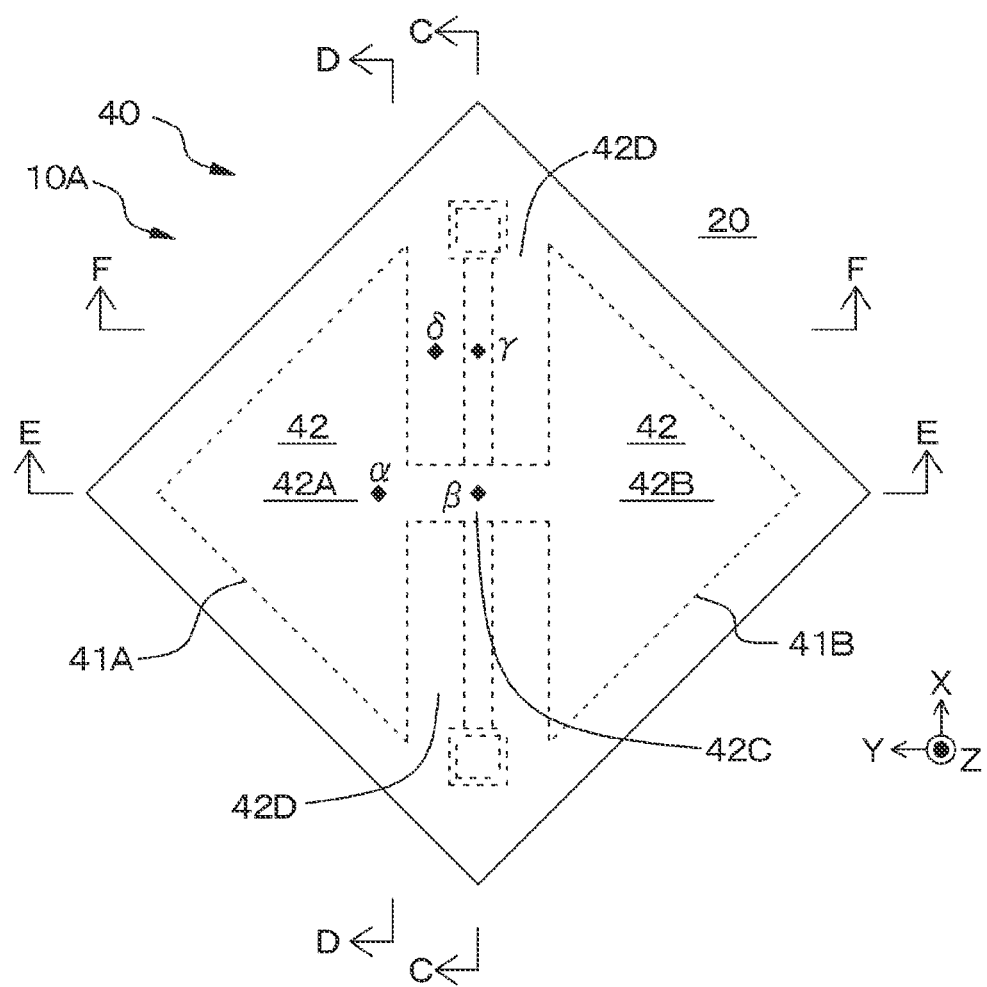
FIG. 2 is a schematic plan view of an upper support layer constituting the light reflecting element of Example 1.
Figure 3:
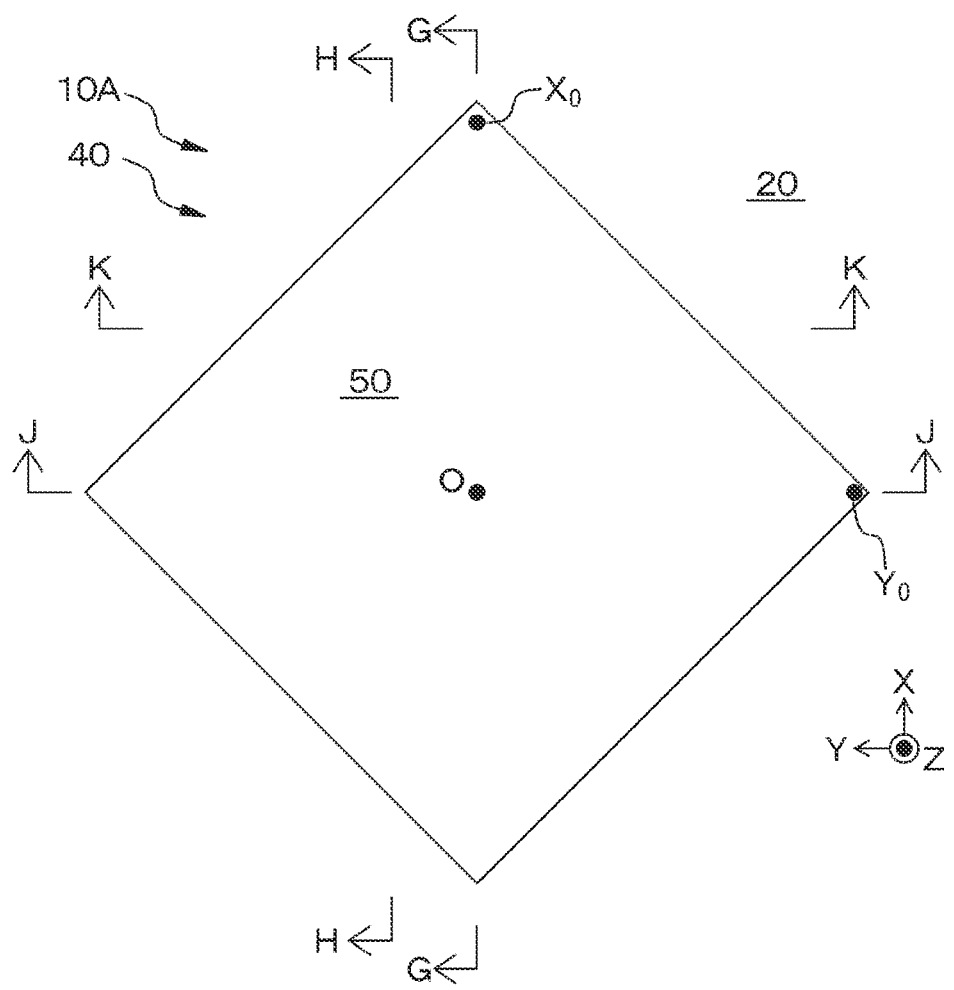
FIG. 3 is a schematic plan view of a light reflecting layer constituting the light reflecting element of Example 1.
Figure 4A:
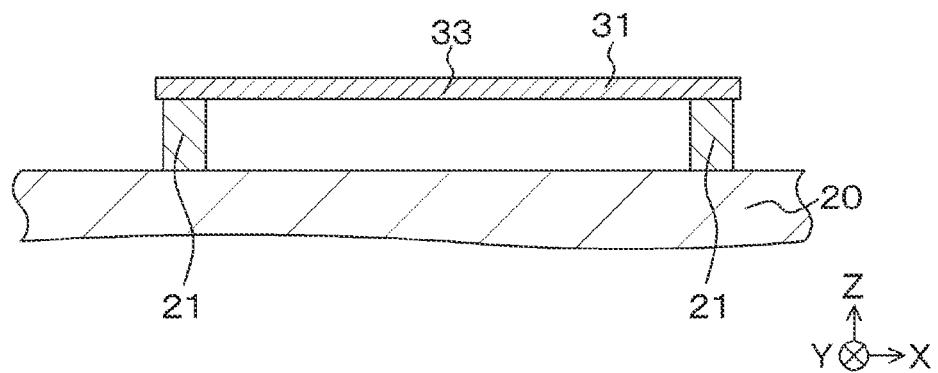
FIGS. 4A and 4B are a schematic cross-sectional view taken along an arrow A-A in FIG. 1A and a schematic cross-sectional view taken along an arrow B-B in FIG. 1A, respectively.
Figure 4B:
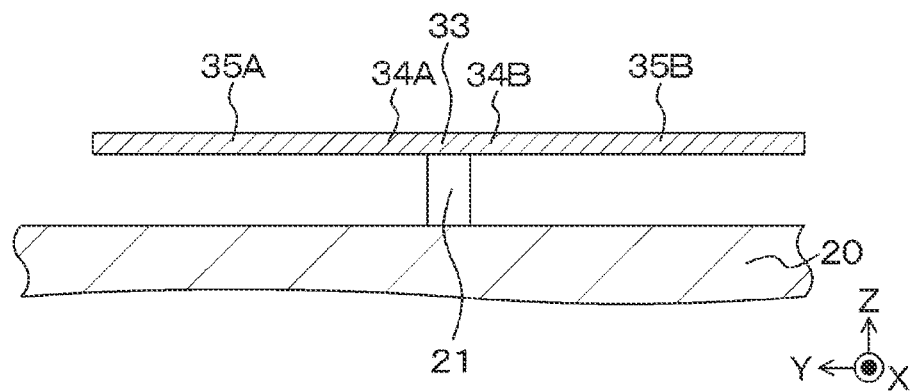
Figure 5A:
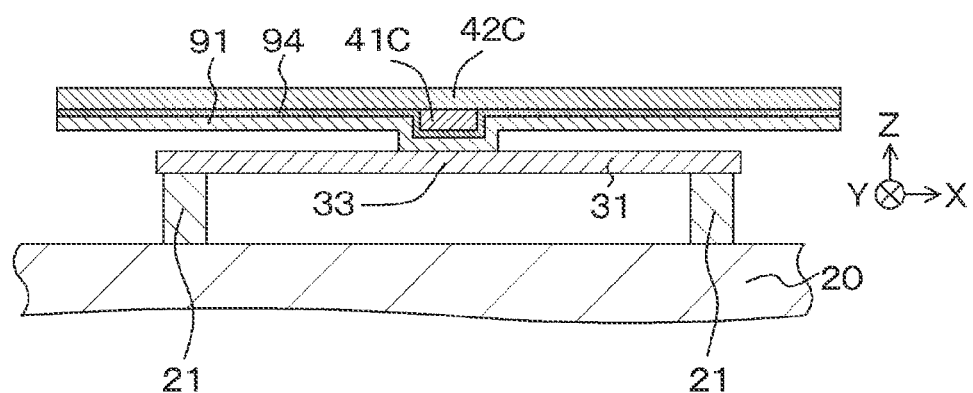
FIGS. 5A and 5B are a schematic end view taken along an arrow C-C in FIG. 2 and a schematic cross-sectional view taken along an arrow D-D in FIG. 2, respectively.
Figure 5B:
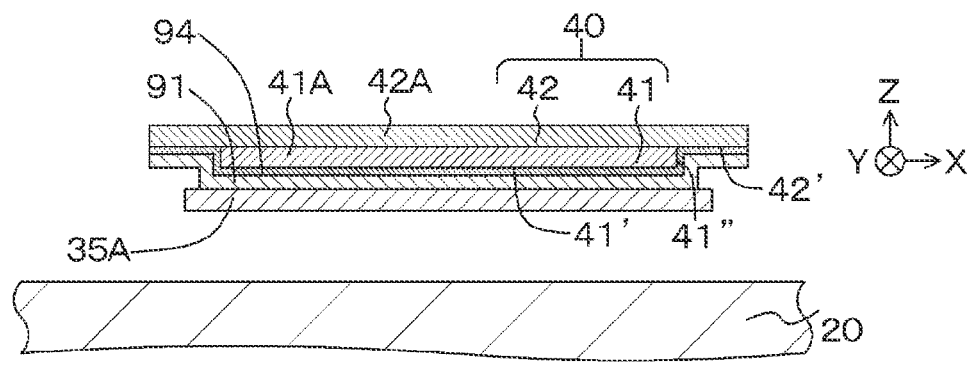
Figure 6A:
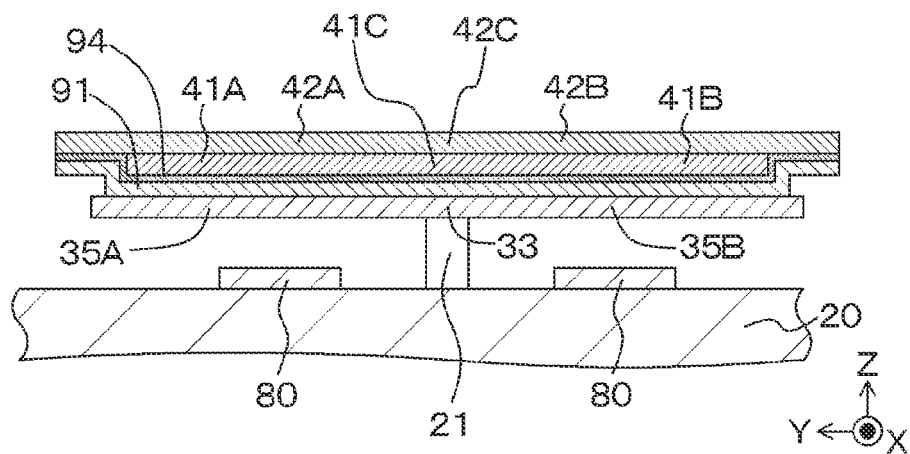
FIGS. 6A and 6B are a schematic cross-sectional view taken along an arrow E-E in FIG. 2 and a schematic cross-sectional view taken along an arrow F-F in FIG. 2, respectively.
Figure 6B:
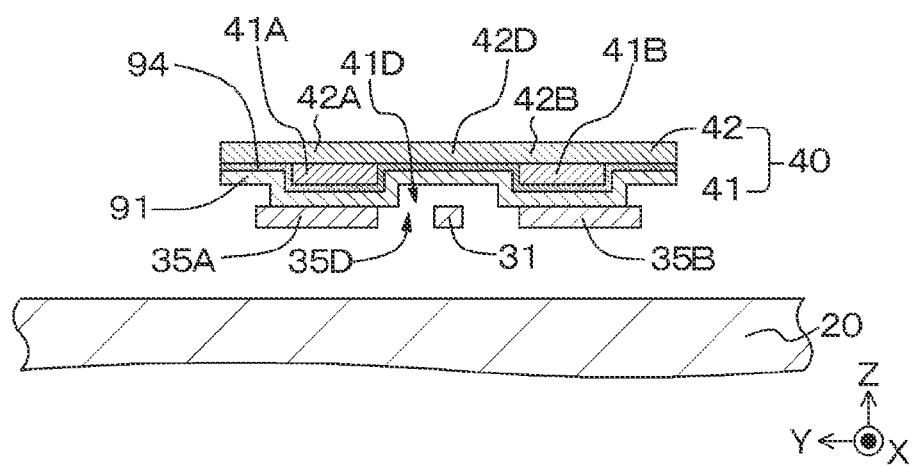
Figure 7A:
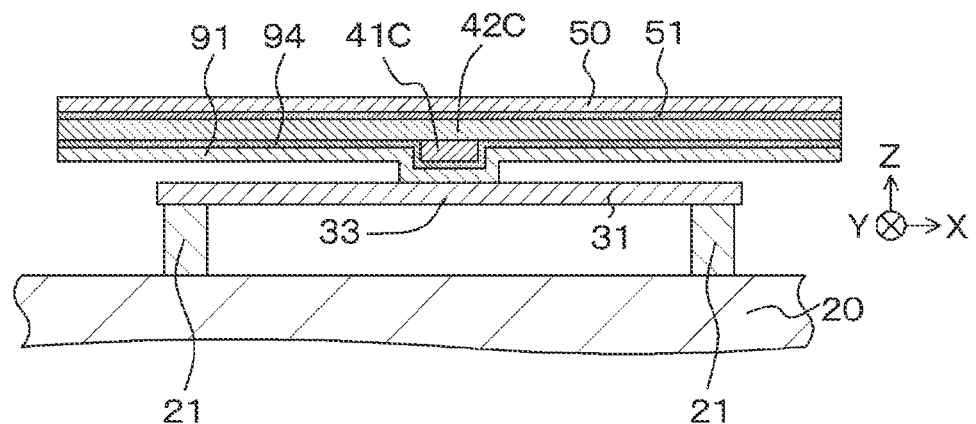
FIGS. 7A and 7B are a schematic end view taken along an arrow G-G in FIG. 3 and a schematic cross-sectional view taken along an arrow H-H in FIG. 3, respectively.
Figure 7B:
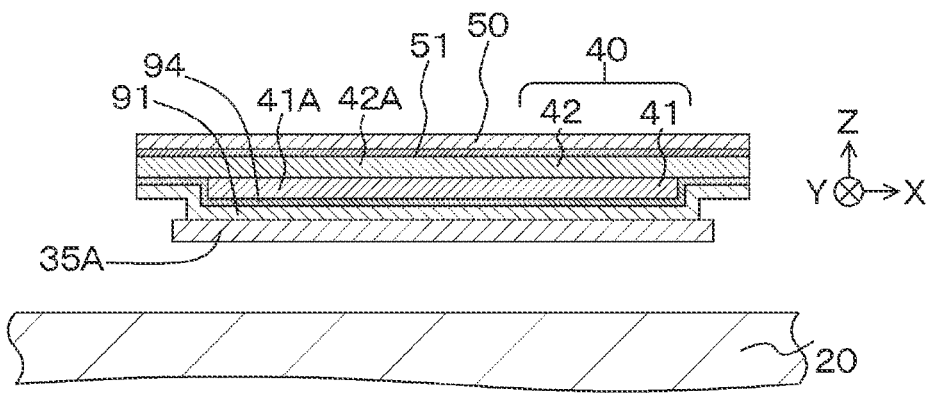
Figure 8A:
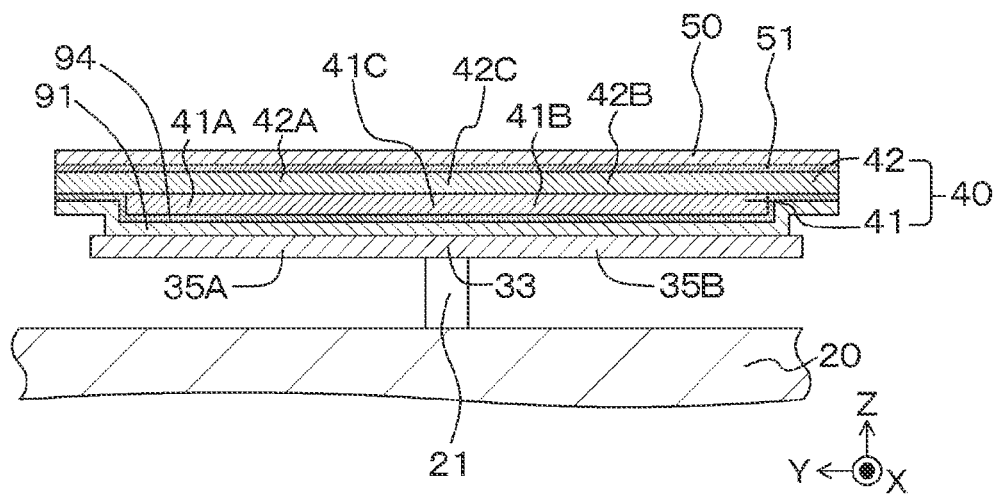
FIGS. 8A and 8B are a schematic end view taken along an arrow J-J in FIG. 3 and a schematic cross-sectional view taken along an arrow K-K in FIG. 3, respectively.
Figure 8B:
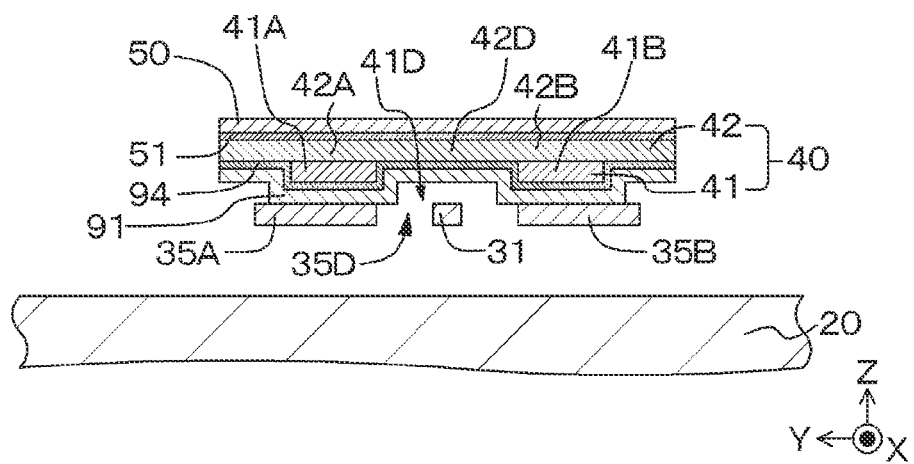

Example 1 relates to a light reflecting element and a spatial light modulator of the present disclosure, and specifically relates to the light reflecting element having the first configuration. A schematic plan view of a support part and a hinge part constituting a light reflecting element of Example 1 is illustrated in FIG. 1A, a schematic plan view of a lower support layer is illustrated in FIG. 1B, a schematic plan view of an upper support layer constituting the light reflecting element is illustrated in FIG. 2, and a schematic plan view of the light reflecting layer is illustrated in FIG. 3. Furthermore, a schematic cross-sectional view taken along an arrow A-A in FIG. 1A is illustrated in FIG. 4A, a schematic cross-sectional view taken along an arrow B-B in FIG. 1A is illustrated in FIG. 4B, a schematic end view taken along an arrow C-C in FIG. 2 is illustrated in FIG. 5A, a schematic cross-sectional view taken along an arrow D-D in FIG. 2 is illustrated in FIG. 5B, a schematic cross-sectional view taken along an arrow E-E in FIG. 2 is illustrated in FIG. 6A, a schematic cross-sectional view taken along an arrow F-F in FIG. 2 is illustrated in FIG. 6B, a schematic end view taken along the an arrow G-G in FIG. 3 is illustrated in FIG. 7A, a schematic cross-sectional view taken along an arrow H-H in FIG. 3 is illustrated in FIG. 7B, a schematic cross-sectional view taken along an arrow J-J in FIG. 3 is illustrated in FIG. 8A, and a schematic cross-sectional view taken along an arrow K-K in FIG. 3 is illustrated in FIG. 8B. Note that in FIG. 2, an illustration of the movable piece is omitted.

Light reflecting elements 10A, 10B, 10C, 10D, 10E, 10F of Example 1 or Examples 2 to 5 as described later include a support part 21 provided on a substrate 20, and a hinge part 30 and a light reflecting part 40, in which the light reflecting part 40 includes a support layer (mirror plate) and a light reflecting layer (mirror portion) 50 formed on the support layer, the hinge part 30 includes a torsion bar portion 31, a first extending portion 34A extending from a part of one side 32A of the torsion bar portion 31, a first movable piece 35A extending from an end of the first extending portion 34A, a second extending portion 34B extending from a part of the other side 32B of the torsion bar portion 31, and a second movable piece 35B extending from an end of the second extending portion 34B, an end of the torsion bar portion 31 is fixed to the support part 21, the hinge part 30 is capable of being twisted and deformed around an axis of the torsion bar portion 31, and the support layer is formed from above the first movable piece 35A to above the second movable piece 35B.

A recess 41D is provided at least in a portion of the support layer facing a space 35D located between the first movable piece 35A and the second movable piece 35B. That is, the recess 41D is provided in an area interposed between a portion of the first movable piece 35A (an edge of the first movable piece 35A facing the torsion bar portion 31) and a portion of the second movable piece 35B (an edge of the second movable piece 35B facing the torsion bar portion 31) facing each other. Specifically, in the light reflecting elements 10A, 10B, 10C, 10D of Example 1 or Examples 4 and 5 as described later, the recess (kind of cavity) 41D is provided in a portion of the support layer facing the space 35D that is partitioned by the first movable piece 35A, the first extending portion 34A, the second extending portion 34B, and the second movable piece 35B.

Then, stress adjusting layers 91, 92, 93 are provided on the support layer in parallel to the light reflecting layer 50 and separated from the light reflecting layer 50.

Figure 27:
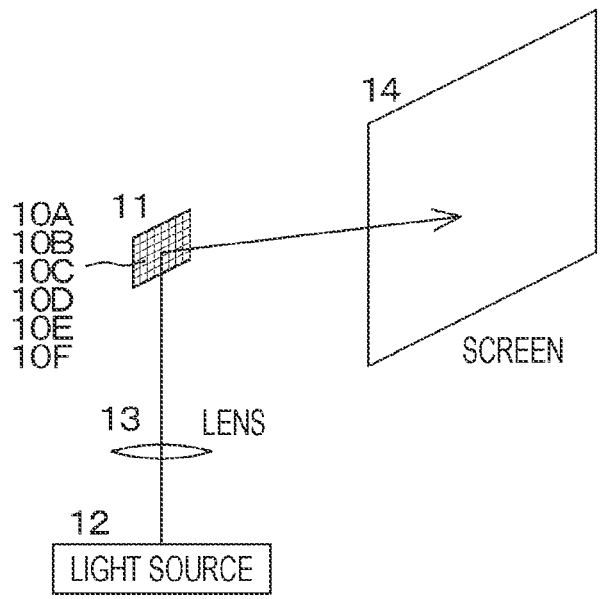
FIG. 27 is a conceptual diagram of a spatial light modulator of the present disclosure.

Furthermore, as illustrated in a conceptual diagram in FIG. 27, the spatial light modulators of Example 1 or Examples 2 to 5 as described later are spatial light modulators in which light reflecting elements are arranged in an array, and each light reflecting element is formed by the light reflecting elements 10A, 10B, 10C, 10D, 10E, 10F of Example 1 or Examples 2 to 5 as described later. The light emitted from the light source 12 passes through an optical system (lens) 13 and is incident on a spatial light modulator 11. Then, the light incident on the light reflecting layer 50 of the light reflecting elements 10A, 10B, 10C, 10D, 10E, 10F constituting the spatial light modulator 11 is reflected by the light reflecting layer 50 under control of the light reflecting element, and is emitted toward the screen 14 as desired. By driving the hinge part 30, a light emitting direction from the light reflecting layer 50 to the screen 14 can be controlled, and consequently, an image can be displayed on the screen 14. The spatial light modulator 11 can control on and off of the incident light.

Here, in the light reflecting elements 10A, 10B, 10C, 10D of Example 1 or Examples 2 to 4 as described later, both ends of the torsion bar portion 31 are fixed to the support part 21. That is, two support parts 21 are provided.

Furthermore, in the light reflecting elements 10A, 10B, 10C, 10D, 10E, 10F of Example 1 or Examples 2 to 5 as described later, the first extending portion 34A and the second extending portion 34B are arranged line-symmetrically with the axis of the torsion bar portion 31 being an axis of symmetry, and the first movable piece 35A and the second movable piece 35B are arranged line-symmetrically with the axis of the torsion bar portion 31 being an axis of symmetry. Then, when the hinge part 30 is not twisted and deformed, the first movable piece 35A and the second movable piece 35B are located parallel to a surface of the substrate 20. The light reflecting part 40 covers the support part 21.

Then, in the light reflecting elements 10A, 10B, 10C of Example 1 or Examples 2 to 3 as described later, the support layer has a two-layer structure of a lower support layer (lower mirror plate) 41 and an upper support layer (upper mirror plate) 42, the lower support layer 41 includes a first lower support layer 41A, a second lower support layer 41B, and a third lower support layer 41C, the first lower support layer 41A is formed above the first movable piece 35A, the second lower support layer 41B is formed above the second movable piece 35B, the third lower support layer 41C is formed above the first extending portion 34A, above the second extending portion 34B, and above a part 33 of the torsion bar portion 31 located between the first extending portion 34A and the second extending portion 34B, and the upper support layer 42 is formed on and from the first lower support layer 41A to the second lower support layer 41B including the third lower support layer 41C.

Specifically, as illustrated in FIG. 2, the upper support layer 42 is formed on the first lower support layer 41A, the third lower support layer 41C, and the second lower support layer 41B, and above a space (recess 41D) surrounded by the first lower support layer 41A, the second lower support layer 41B, and the third lower support layer 41C. Areas of the upper support layer respectively facing the first movable piece 35A and the second movable piece 35B, that is, a first upper support layer occupying an area above the first movable piece 35A and a second upper support layer occupying an area above the second movable piece 35B are denoted by reference signs 42A and 42B, and an area of the upper support layer (third upper support layer) formed from the first upper support layer 42A to the second upper support layer 42B is represented by a reference sign 42C. Furthermore, an area of the upper support layer located above the recess 41D is indicated by a reference sign 42D. The recess 41D is provided on a surface of a side of the substrate of the support layer.

Then, in the light reflecting element 10A of Example 1, the stress adjusting layer 91 is provided from an exposed surface 42' of the lower surface of the upper support layer 42 facing the substrate 20 to a lower surface 41' of the lower support layer 41 facing the substrate 20. Specifically, the stress adjusting layer 91 is provided on an exposed surface 42' of a lower surface of the upper support layer 42 facing the substrate 20, a lower surface 41' of the lower support layer 41 facing the substrate 20, and a side surface 41" of the lower support layer 41 that connects the exposed surface 42' of the lower surface of the upper support layer 42 and the lower surface 41' of the lower support layer 41. That is, in Example 1, not all the areas of the stress adjusting layer 91 are provided parallel to the light reflecting layer 50, but a partial area of the stress adjusting layer 91 is provided parallel to the light reflecting layer 50.

An electrode 80 for twisting and deforming the hinge part 30 around the axis of the torsion bar portion 31 is provided on a portion of the substrate 20 facing each of the first movable piece 35A and the second movable piece 35B. Note that the electrode 80 is illustrated only in FIG. 6A. Specifically, the light reflecting elements 10A, 10B, 10C, 10D, 10E, 10F are driven by torsional deformation of the hinge part 30. The electrode (drive electrode) 80 is provided in a portion of the substrate 20 located below the first movable piece 35A and the second movable piece 35B, and by electrostatic force generated between the hinge part 30 (specifically, the first movable piece 35A and the second movable piece 35B) and the drive electrode 80 by applying a voltage to the hinge part 30 and the drive electrode 80, the hinge part 30 can be driven (rotated) or the torsion bar portion 31 can be twisted, or front ends of the movable pieces 35A and 35B can be driven (moved up and down).

The substrate 20 can be constituted of, for example, a silicon substrate. The support part 21 is formed by amorphous silicon (α-Si), the hinge part 30 includes TiAlN, the lower support layer 41 and the upper support layer 42 are formed by amorphous silicon (α-Si), and the light reflecting layer 50 is formed by aluminum (Al). A second base layer (second intermediate layer) 51 including TiN is formed on a top surface of the upper support layer 42. The second base layer 51 also functions as a barrier layer against the aluminum layer. The Young's modulus (unit:GPa), Poisson's ratio, and coefficient of linear expansion (unit:ppm/° C.) of each material are illustrated in Table 1 below. Furthermore, Table 1 illustrates the film formation temperature (unit: ° C.) of each layer. Moreover, thicknesses of the layers constituting the light reflecting element 10A of Example 1, the light reflecting element 10B of Example 2 as described later, and the light reflecting element 10C of Example 3 as described later are illustrated in Tables 2, 3, and 4.

In the light reflecting elements 10A, 10B, 10C, 10D, 10E, 10F of Example 1 or Examples 2 to 5 as described later, a material forming at least a part of the light reflecting layer 50 and a material forming at least a part of the stress adjusting layers 91, 92, 93 are the same. Specifically, the materials forming the light reflecting layer 50 and the material forming the stress adjusting layers 91, 92, 93 are the same. More specifically, the light reflecting layer 50 and the stress adjusting layers 91, 92, 93 are formed by aluminum (Al). A first base layer (first intermediate layer) 94 formed by TiN is formed at an interface between the stress adjusting layer 91 and the upper support layer 42 and an interface with the lower support layer 41. The first base layer 94 also functions as a barrier layer against the aluminum layer. Furthermore, a thickness of the light reflecting layer 50 and a thickness of the stress adjusting layer are the same (substantially the same). Moreover, the configuration of the light reflecting layers (the light reflecting layer 50 and the second base layer 51) and the configuration of the stress adjusting layers (the stress adjusting layers 91, 92, 93 and the first base layer 94) are symmetric with respect to layers existing between the light reflecting layer 50 and the stress adjusting layers 91, 92, 93 (the lower support layer 41 and the upper support layer 42 in Example 1, the upper support layer B (42b) as described later in Example 2, and the upper support layer 42 in Example 3).

TABLE 1

| | Material | Young's modulus | Poisson's ratio | Coefficient of linear expansion | Film formation temperature |
|---|---|---|---|---|---|
| Light reflecting layer | Al | 85 | 0.3 | 23 | 50 |
| Second base layer | TiN | 520 | 0.3 | 9.4 | 100 |
| Upper support layer | α-Si | 138 | 0.3 | 3.6 | 50 |
| Lower support layer | α-Si | 138 | 0.3 | 3.6 | 50 |
| First base layer | TiN | 520 | 0.3 | 9.4 | 100 |
| Stress adjusting layer | Al | 85 | 0.3 | 23 | 50 |
| Hinge part | TiAlN | 209 | 0.3 | 9.5 | 50 |
| Support part | α-Si | 138 | 0.3 | 3.6 | |

TABLE 2

(Example 1)

| | Thickness (nm) |
|---|---|
| Light reflecting layer 50 | 80 |
| Second base layer 51 | 15 |
| Upper support layer 42 | 215 |
| Lower support layer 41 | 200 |
| First base layer 94 | 15 |
| Stress adjusting layer 91 | 80 |
| Hinge part 30 | 50 |

TABLE 3

(Example 2)

| | Thickness (nm) |
|---|---|
| Light reflecting layer 50 | 80 |
| Second base layer 51 | 15 |
| Upper support layer B (42b) | 107.5 |
| First b base layer 94b | 15 |
| Stress adjusting layer 92 | 80 |
| First a base layer 94a | 15 |
| Upper support layer A (42a) | 107.5 |
| Lower support layer 41 | 200 |
| Hinge part 30 | 50 |

TABLE 4

(Example 3)

| | Thickness (nm) |
|---|---|
| Light reflecting layer 50 | 80 |
| Second base layer 51 | 15 |
| Upper support layer 42 | 215 |
| First b base layer 94b | 15 |
| Stress adjusting layer 93 | 80 |
| First a base layer 94a | 15 |
| Lower support layer 41 | 200 |
| Hinge part 30 | 50 |

The total thickness of the upper support layer 42 and the lower support layer 41 in a light reflecting element of Comparative Example 1 is assumed as $T_0$ (=415 nm). Distances from an interface between the second base layer 51 and the upper support layer 42 in the light reflecting elements 10A, 10B, 10C of Example 1, Example 2, and Example 3 Example 3 to main area of the stress adjusting layers 91, 92, 93 are assumed as $T_1$, $T_2$, $T_3$. Table 5 below illustrates values obtained by dividing values of $T_1$, $T_2$, $T_3$ by the value of $T_0$ (hereinafter referred to as "thickness ratio T").

TABLE 5

(Thickness ratio T)

| | |
|---|---|
| $T_1/T_0 = 1.00$ | (= 415/415) |
| $T_2/T_0 = 0.26$ | (= 107.5/415) |
| $T_3/T_0 = 0.52$ | (= 215/415) |

Figure 25:
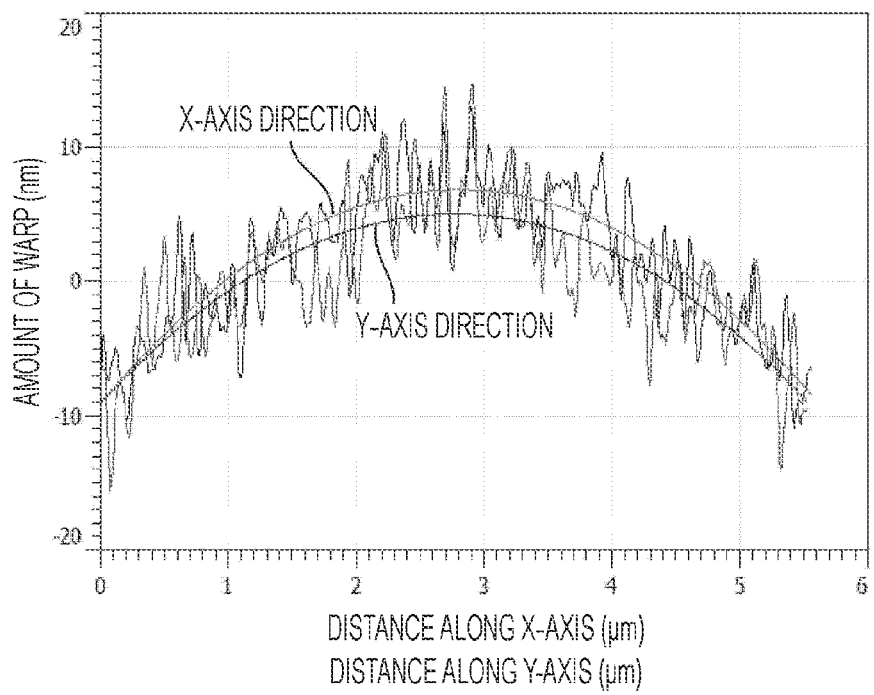
FIG. 25 is a graph illustrating an amount of warp obtained in the modification of Example 1.

The light reflecting element of Comparative Example 1 was prototyped, and the amount of warp was determined. A warp occurs in the light reflecting element due to the stress difference generated in constituent materials of the light reflecting element, and when the radius of curvature of warp is R and a chord length is D when the light reflecting element is assumed to warp in an arc shape, the amount of warp (that is, arrow height) h can be represented by $h = R[1-\{1-(D/2R)^2\}^{1/2}] = D^2/8R$. As a result of determining the amount of warp h of the light reflecting element of the modification example of Example 1 at a temperature of 25° C. (room temperature), the amount of warp h was 15 nm as illustrated in FIG. 25. Note that the horizontal axis in FIG. 25 indicates a position (unit: μm) along an X-axis and a Y-axis as described later, the vertical axis indicates the amount of warp (unit: nm), a curve of unevenness of the amount of warp along the X-axis and the Y-axis illustrates a profile, and a smooth curve fitting these profiles is also illustrated.

Figure 21A:
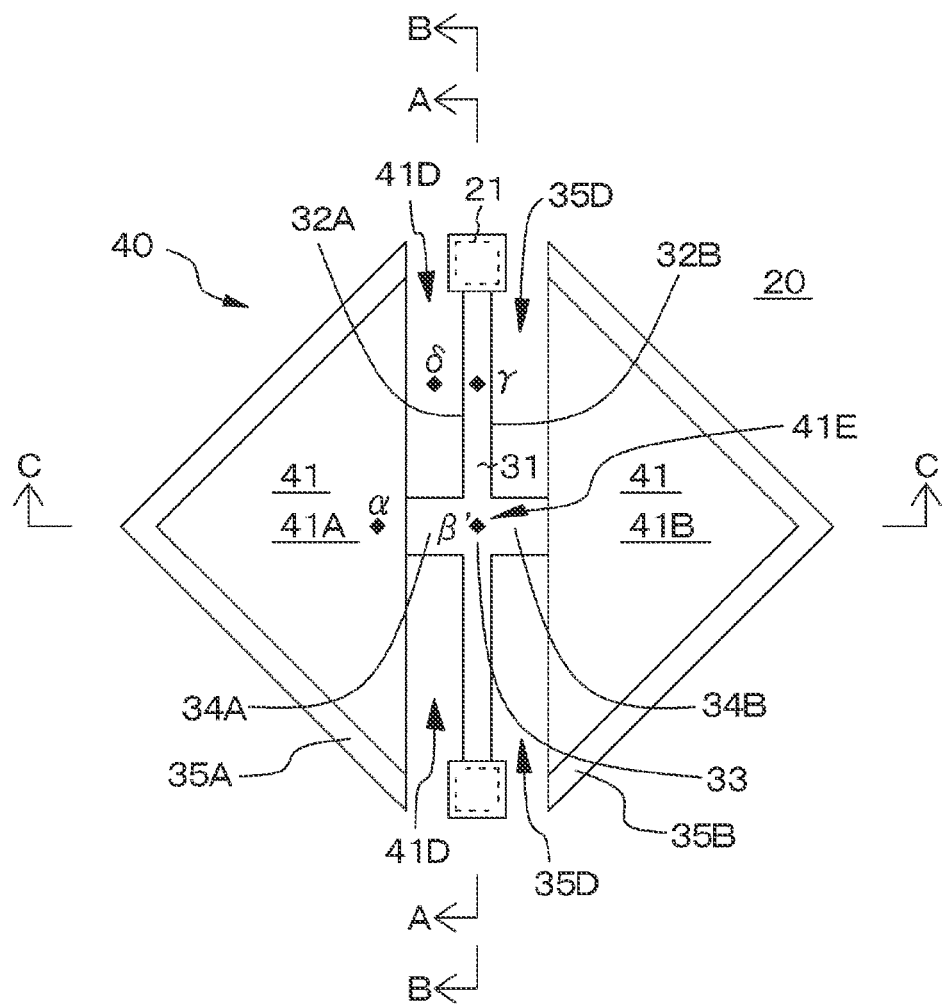
FIGS. 21A and 21B are a schematic plan view of a lower support layer constituting a light reflecting element of a modification example of Example 1, and a schematic end view of the lower support layer and so on constituting the light reflecting element of the modification example of Example 1 taken along an arrow A-A in FIG. 21A, respectively.
Figure 21B:
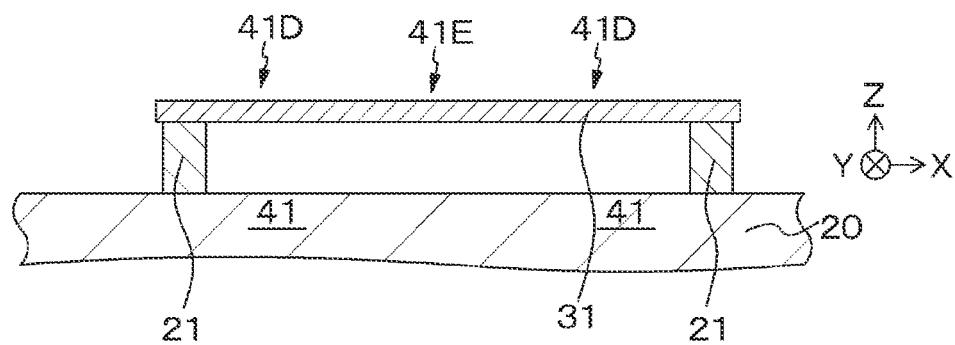
Figure 22A:
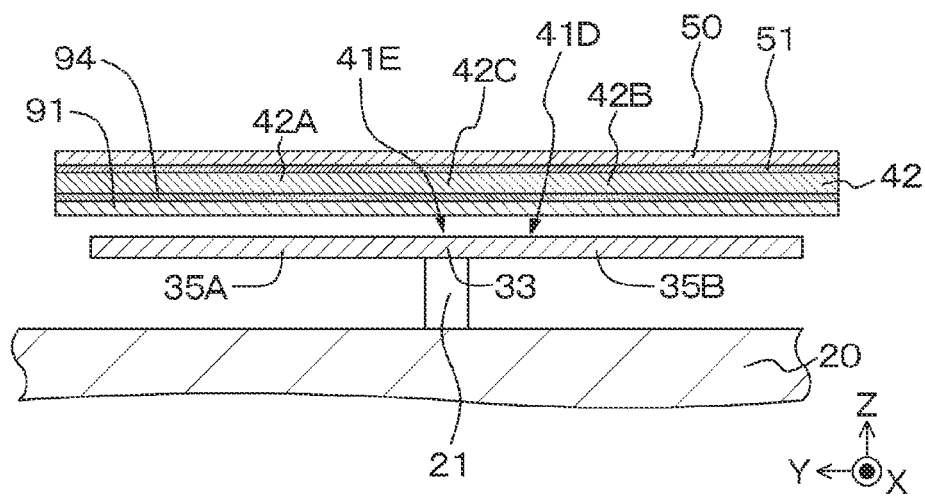
FIGS. 22A and 22B are a schematic end views of the lower support layer and so on constituting the light reflecting element of the modification example of Example 1 taken along arrows B-B and C-C in FIG. 21A, respectively.
Figure 22B:
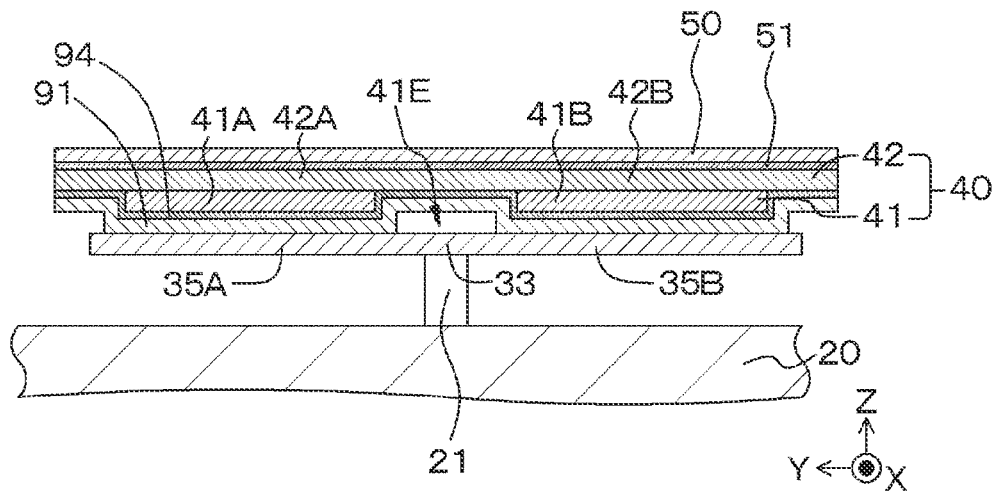

The light reflecting element of the modification example of Example 1 is constituted of the light reflecting element having the second configuration. A schematic plan view of a lower support layer constituting a light reflecting element of the modification example of Example 1 is illustrated in FIGS. 21A and 21B, a schematic end view of the lower support layer and so on constituting the light reflecting element of the modification example of Example 1 taken along an arrow A-A in FIG. 21A is illustrated in FIG. 21B, and schematic end views of the lower support layer and so on constituting the light reflecting element of the modification example of Example 1 taken along arrows B-B and C-C in FIG. 21A are illustrated in FIG. 22A and FIG. 22B. Note that FIG. 22A also illustrates the upper support layer 42, and FIG. 22B also illustrates the upper support layer 42, the second base layer 51, and the light reflecting layer 50.

Also in the light reflecting element of the modification of Example 1, the recess 41D is provided in the portion of the support layer facing the space 35D located between the first movable piece 35A and the second movable piece 35B. However, the lower support layer 41 includes the first lower support layer 41A and the second lower support layer 41B, and the third lower support layer is not formed. That is, in the light reflecting element of the modification of Example 1, the support layer has a two-layer structure of a lower support layer 41 and an upper support layer 42, the lower support layer 41 includes a first lower support layer 41A and a second lower support layer 41B, the first lower support layer 41A is formed above the first movable piece 35A, the second lower support layer 41B is formed above the second movable piece 35B, and the lower support layer 41 is not formed on the first extension portion 34A, the second extension portion 34B, and a part 33 of the torsion bar portion 31 located between the first extending portion 34A and the second extending portion 34B. There is a second recess 41E communicating with the recess 41D above the first extending portion 34A, the second extending portion 34B, and the part 33 of the torsion bar portion 31. Except for the above points, the configuration and structure of the light reflecting element of the modification of Example 1 are the same as the configuration and structure of the light reflecting element of Example 1.

Figure 23A:
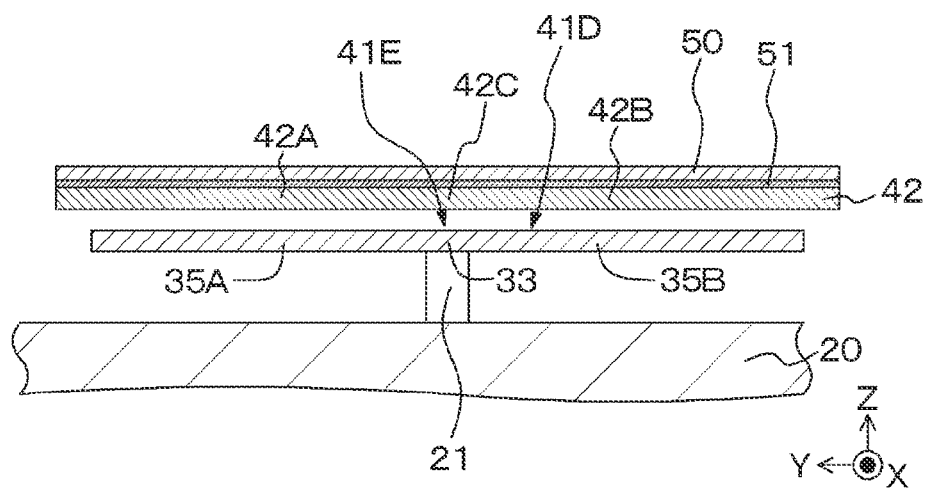
FIGS. 23A and 23B are a schematic end views of a lower support layer and so on constituting a light reflecting element of Comparative Example 1 similar to those taken along arrows B-B and C-C in FIG. 21A, respectively.
Figure 23B:
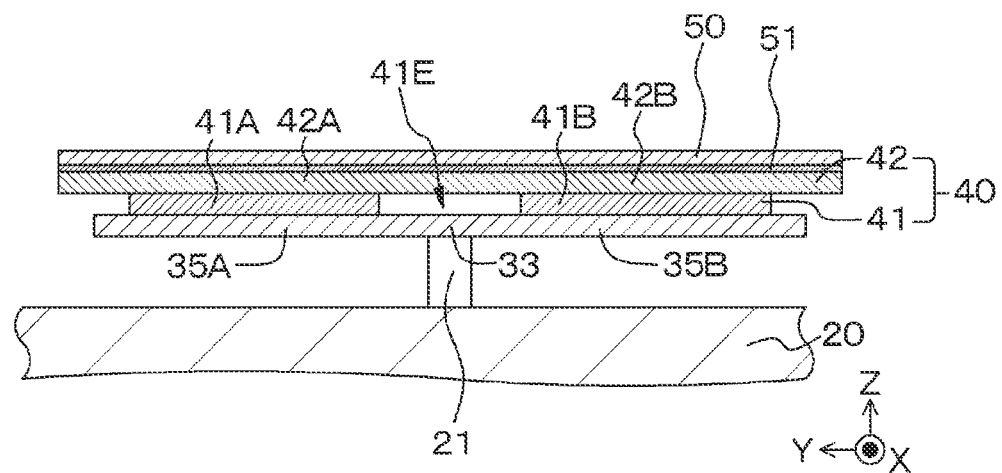

Schematic end views of the light reflecting layer and so on constituting a light reflecting element of Comparative Example 1 similar to those taken along the arrows B-B and C-C in FIG. 21A are illustrated in FIGS. 23A and 23B, respectively. The light reflecting element of Comparative Example 1 has the same configuration and structure as the light reflecting element of the modification example of Example 1 except that the first base layer 94 and the stress adjusting layer 91 are not formed.

Configurations of the layers of the light reflecting element of Example 1 in an α area, a 3 area, a γ area, and a 5 area illustrated in FIG. 2 and configurations of the layers of the light reflecting element of the modification of Example 1 in an α area, a β' area, a γ area, and a δ area illustrated in FIG. 21A are illustrated in Table 6 below. Note that in FIG. 2 and FIG. 21A, these areas are indicated by rhombuses painted in black.

TABLE 6

| | Light reflecting element of Example 1 | Light reflecting element of modification of Example 1 |
|---|---|---|
| (α area) | | |
| Light reflecting layer 50 | Present | Present |
| Second base layer 51 | Present | Present |
| Upper support layer 42 | Present | Present |
| Lower support layer 41 | Present | Present |
| First base layer 94 | Present | Present |
| Stress adjusting layer 91 | Present | Present |
| Hinge part 30 | Present | Present |
| (β area/β' area) | | |
| Light reflecting layer 50 | Present | Present |
| Second base layer 51 | Present | Present |
| Upper support layer 42 | Present | Present |

TABLE 6-continued

| | Light reflecting element of Example 1 | Light reflecting element of modification of Example 1 |
|---|---|---|
| Lower support layer 41 | Present | Absent |
| First base layer 94 | Present | Present |
| Stress adjusting layer 91 | Present | Present |
| Hinge part 30 | Present | Present |
| (γ area) | | |
| Light reflecting layer 50 | Present | Present |
| Second base layer 51 | Present | Present |
| Upper support layer 42 | Present | Present |
| First base layer 94 | Present | Present |
| Stress adjusting layer 91 | Present | Present |
| Lower support layer 41 | Absent | Absent |
| Hinge part 30 | Present | Present |
| (δ area) | | |
| Light reflecting layer 50 | Present | Present |
| Second base layer 51 | Present | Present |
| Upper support layer 42 | Present | Present |
| First base layer 94 | Present | Present |
| Stress adjusting layer 91 | Present | Present |
| Lower support layer 41 | Absent | Absent |
| Hinge part 30 | Absent | Absent |

Figure 28:
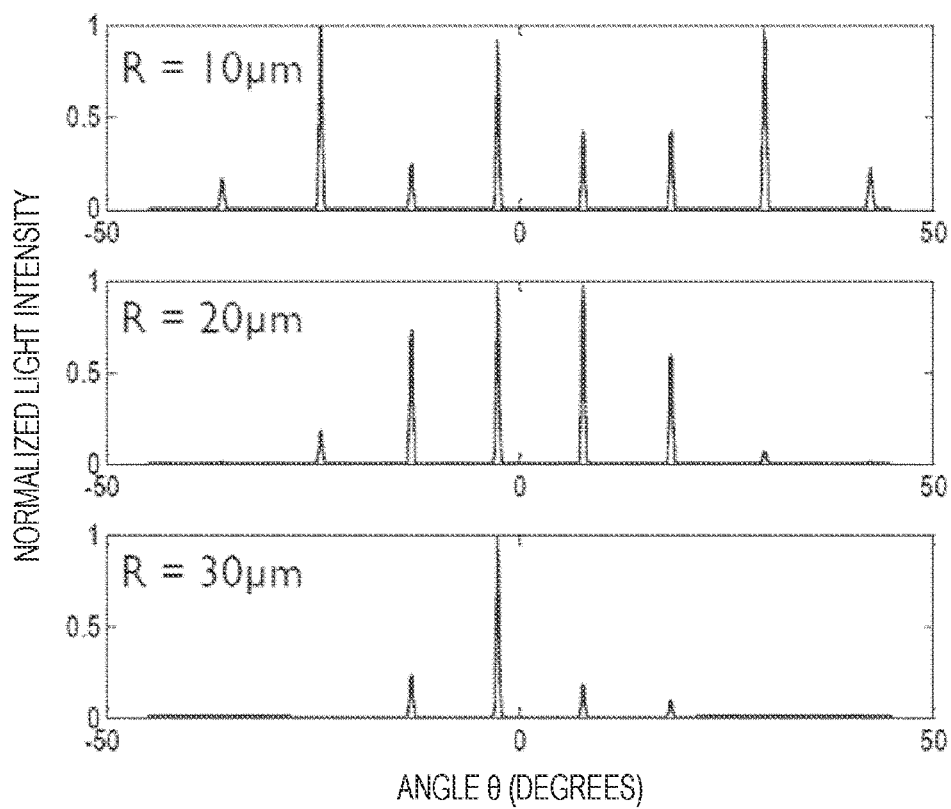
FIG. 28 is a graph illustrating simulation results of a diffraction phenomenon generated by lights from light reflecting elements arranged in an array in the spatial light modulator in which light reflecting elements are arranged in an array.
Figure 29A:
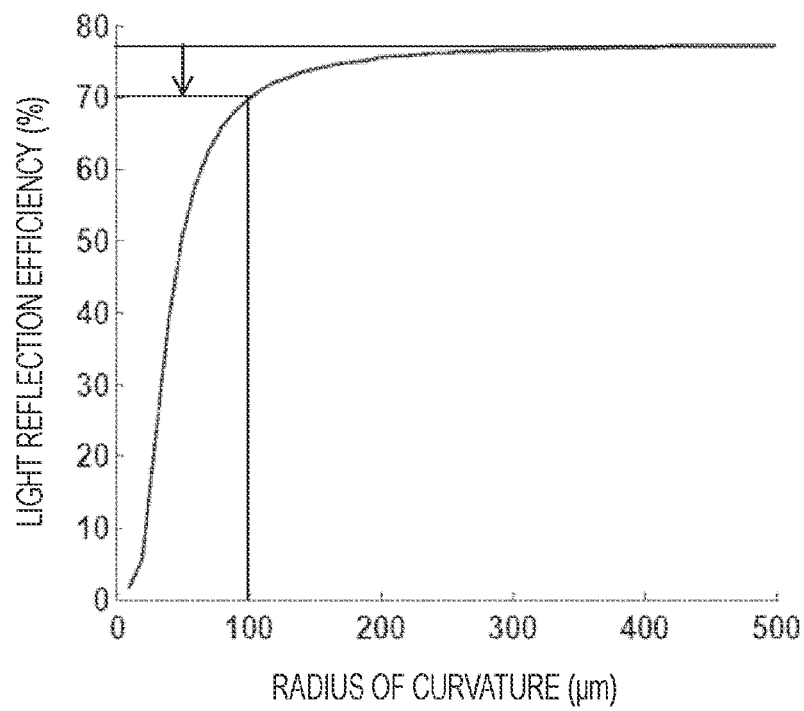
FIGS. 29A and 29B are a graph illustrating a relationship between a radius of curvature R and light reflection efficiency, and a graph illustrating a relationship between the radius of curvature R and an amount of warp h.
Figure 29B:
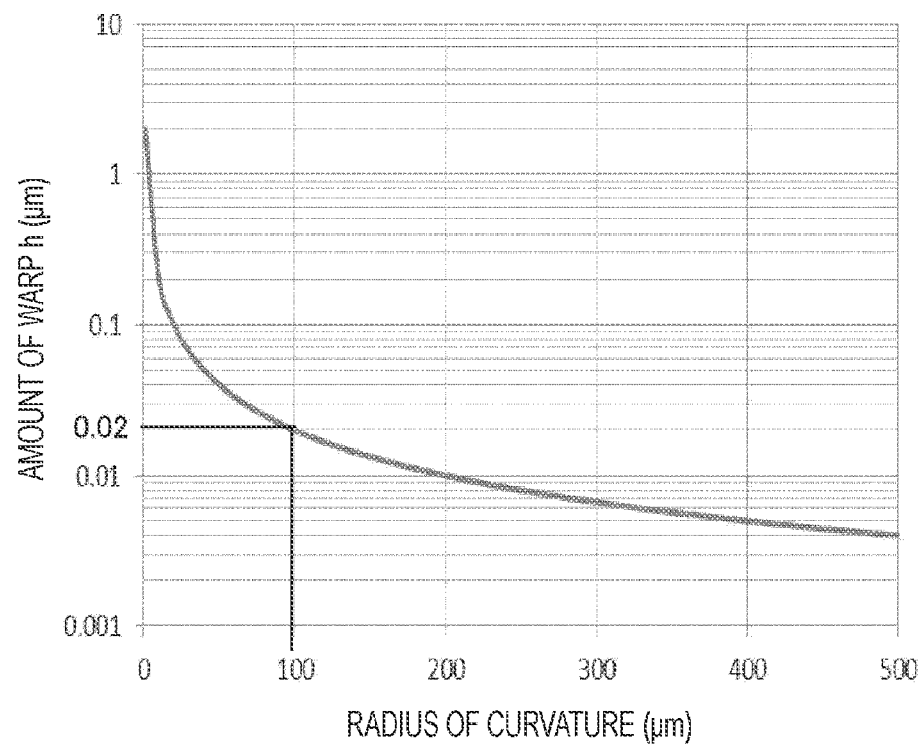

In a spatial light modulator in which light reflecting elements are arranged in an array, a diffraction phenomenon occurs in lights from the light reflecting elements arranged in an array. FIG. 28 is a diagram illustrating simulation results of diffracted light generation when the radius of curvature R=10 μm, R=20 μm, and R=30 μm. From FIG. 28, the smaller the radius of curvature R, that is, the larger the amount of warp, the wider the area where the diffracted light has a peak. Consequently, the light reflection efficiency in a predetermined light reflection direction decreases. From FIGS. 29A and 29B, the value of the radius of curvature R in a case where the light reflection efficiency decreases by 10% is 100 μm, which corresponds to the amount of warp h=20 nm. In other words, in the spatial light modulator, when a warp of 20 nm occurs in the light reflecting element, the light reflection efficiency decreases by 10%.

The amounts of warp of the light reflecting element 10A of Example 1, the light reflecting elements 10B, 10C of Examples 2 to 3 as described later, and Comparative Example 1 were determined by simulation. Results of obtaining the difference ($\Delta_Y$) between the amount of warp at 80° C. and the amount of warp at −20° C. when the temperature is changed from 22° C. to −20° C. and then from −20° C. to 80° C. are illustrated in Table 7 below. The amount of warp is the amount of warp along the Y-axis in FIG. 3 and is the amount of warp at a point $Y_0$ with respect to the center "O" of the light reflecting layer 50. At the same time, Table 7 also illustrates the difference ($\Delta_X$) in the amount of warp along the X-axis in FIG. 3 at the center "O" of the light reflecting layer 50 with respect to the point $X_0$. The X-axis is a straight line connecting the centers of the two support parts 21 and passing through the center "O" of the light reflecting layer 50, the Y-axis is a straight line passing through the center "O" of the light reflecting layer 50, orthogonal to the X-axis, and parallel to the surface of the substrate 20, and the Z axis is a straight line passing through the center "O" of the light reflecting layer 50, and orthogonal to the X axis and the Y axis.

TABLE 7

| | $\Delta_Y$ (nm) | $\Delta_X$ (nm) | |
|---|---|---|---|
| Example 1 | 0.40 | 0.65 | $T_1/T_0 = 1.00$ |
| Example 2 | 7.31 | 5.99 | $T_2/T_0 = 0.26$ |
| Example 3 | 2.11 | 3.13 | $T_3/T_0 = 0.52$ |
| Comparative Example 1 | 11.6 | 9.15 | |

Figure 26:
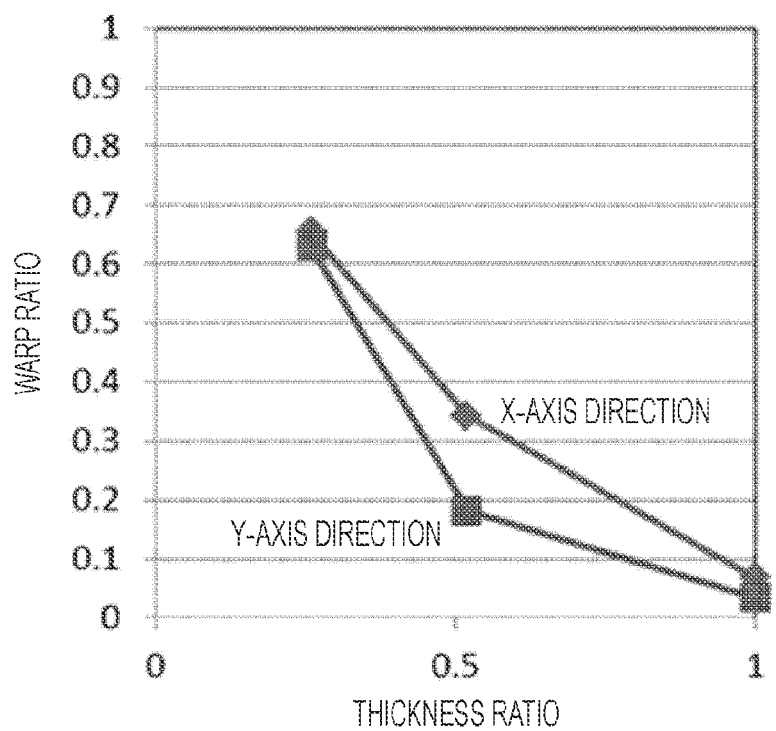
FIG. 26 is a graph illustrating a relationship between a thickness ratio T corresponding to a distance between a light reflecting layer and a stress adjusting layer and a warp ratio.

It can be seen that the amounts of warp in Example 1, Example 2, and Example 3 are smaller than that in Comparative Example 1. In particular, the warp of the light reflecting elements of Examples 1 and 3 is dramatically improved. Furthermore, although the amount of warp decreased in the order of Example 2, Example 3, and Example 1, a correlation can be recognized between the decrease in the amount of warp and the value of the thickness ratio T. That is, the longer the distance between the light reflecting layer 50 and the stress adjusting layer (the thicker the layer existing between the light reflecting layer 50 and the stress adjusting layer), the more the amount of warp due to presence of the stress adjusting layers can be reduced. The relationship between the thickness ratio T corresponding to the distance between the light reflecting layer 50 and the stress adjusting layer and a warp ratio (standardized values of the amounts of warp in the light reflecting elements of Example 1, Example 2, and Example 3 according to the result of Comparative Example 1) is illustrated in the graph in FIG. 26.

For example, Japanese Patent Application Laid-Open No. 2011-242522 discloses a micromirror device in which a stress control layer and a reflection layer are stacked, and describes that rigidity of a mirror portion can be increased by providing the stress control layer. However, from the above discussion, if the stress control layer and the reflection layer are stacked (that is, at the thickness ratio T=0), the warp reduction effect in the light reflecting element is small, and the stress adjusting layer in the present disclosure is intended to increase rigidity by stacking a film having compressive stress and a film having tensile stress, and is not intended to correct a warp by stress balance. Furthermore, Japanese Patent Application Laid-Open No. 2002-267996 discloses an optical scanning apparatus in which a mirror surface is formed on one surface of a mirror substrate, and a metal thin film having compressive stress is formed on the other surface of the mirror substrate. However, if a metal thin film (stress adjusting layer in the light reflecting element of the present disclosure) is provided on the other surface of the mirror substrate (that is, on the surface facing the substrate of the hinge part of the light reflecting element of the present disclosure), the thickness of the torsion bar portion becomes thicker, and stress is applied to the torsion bar portion and hinders twisting operation, deteriorating the function as the light reflecting element.

In the light reflecting element 10A of Example 1, the effect of warp in a case where the film thickness of the stress adjusting layer 91 is changed was examined. Specifically, the relationship between synthetic film stress and the amount of warp at temperatures of −20° C. and 80° C. is illustrated in Table 9 below, in a case where the film thickness of the stress adjusting layer 91 is changed to 80 nm (Example 1A) and 40 nm (Example 1B), and to 0 nm (Comparative Example 1A), and in the light reflecting element of Comparative Example 1. Note that in Example 1A, Example 1B, and Comparative Example 1A, the first base layer 94 constituted of TiN with a thickness of 15 nm is formed.

The synthetic film stress represented by Equation (1) is the sum of values obtained by multiplying the film stress of each layer constituting the stress adjusting layer or the light reflecting layer by a film thickness ratio of the stress adjusting layer or the light reflecting layer.

$$\text{Synthetic film stress} = \Sigma \text{film stress} \times \text{film thickness ratio} \quad (1)$$

Here, the "film thickness ratio" is represented by (thickness of each layer constituting the stress adjusting layer or the light reflecting layer)/(total thickness of the support layers 41 and 42), and is represented by (thickness of each layer)/415 in Example 1. Furthermore, the film stress σ is a value derived from Equation (2) using the Young's modulus E of materials forming each layer, a linear expansion coefficient α, and the temperature difference ΔT between a film formation temperature and a maximum temperature specification value or a minimum temperature specification value according to physical property values in Table 8.

$$\sigma = -E \cdot \alpha \cdot \Delta T \quad (2)$$

Note that in Table 8, "film stress 1" (unit:MPa) is film stress at the minimum temperature specification value (−20° C.), and "film stress 2" (unit:MPa) is film stress at the maximum temperature specification value (80° C.).

When a surface of the substrate is an XY plane, a stress at a maximum temperature specification value is $\sigma_{11}$ and a stress at a minimum temperature specification value is $\sigma_{12}$ among stresses (which are synthetic film stresses, which similarly applies below) generated in a plane parallel to the XY plane of the light reflecting layer 50, and a stress at a maximum temperature specification value is $\sigma_{12}$ and a stress at a minimum temperature specification value is $\sigma_{22}$ among stresses generated in a plane parallel to the XY plane of the stress adjusting layer 91. Note that in Example 1, the maximum temperature specification value is 80° C. and the minimum temperature specification value is −20° C.

TABLE 8

| | Material | Young's modulus | Coefficient of linear expansion | Film formation temperature | Film stress 1 | Film stress 2 |
|---|---|---|---|---|---|---|
| Light reflecting layer | Al | 85 | 23 | 50 | 137 | −59 |
| Second base layer | TiN | 520 | 9.4 | 100 | 583 | 97 |
| Stress adjusting layer | Al | 85 | 23 | 50 | 137 | −59 |
| First base layer | TiN | 520 | 9.4 | 100 | 583 | 97 |

TABLE 9

| | Example 1A | Example 1B | Comparative Example 1A | Comparative Example 1 |
|---|---|---|---|---|
| $\sigma_{11}$ | −7.78 | −7.78 | −7.78 | −7.78 |
| $\sigma_{12}$ | 47.4 | 47.4 | 47.4 | 47.4 |
| $\sigma_{21}$ | −7.78 | −2.13 | 3.51 | — |
| $\sigma_{22}$ | 47.4 | 34.3 | 21.1 | — |
| $\Delta_X$ (nm) | 0.65 | 2.43 | 5.77 | 9.15 |
| $\Delta_Y$ (nm) | 0.40 | 3.67 | 7.88 | 11.6 |

As can be seen from Table 9, when the sign of $\sigma_{11}$ and the sign of $\sigma_{21}$ are the same, and the sign of $\sigma_{12}$ and the sign of $\sigma_{22}$ are the same, stress generated in the light reflecting layer and stress generated in the stress adjusting layer can cancel each other, and thus the warp can be reduced. Furthermore, from Examples 1A and 1B, it can be seen that the closer the value of the synthetic film stress of the light reflecting layer and the value of the synthetic film stress of the stress adjusting layer are, the greater the effect of reducing the warp. In a case where the signs of the synthetic film stresses of the light reflecting layer and the stress adjusting layer are different as in the cases of $\sigma_{11}$ and $\sigma_{21}$ of Comparative Example 1A, a bending moment is generated in the light reflecting element and the warp of the light reflecting element increases. From the above, it is preferable that the sign of $\sigma_{11}$ and the sign of $\sigma_{21}$ are the same, the sign of $\sigma_{12}$ and the sign of $\sigma_{22}$ are the same, and further, it is more preferable to bring the value of $\sigma_{11}$ and the value of $\sigma_{21}$ close to each other, and the value of $\sigma_{12}$ and the value of $\sigma_{22}$ close to each other.

As described above, in the light reflecting element of the present disclosure, since the support layer is provided with the stress adjusting layer parallel to the light reflecting layer and separated from the light reflecting layer, it is possible to provide a light reflecting element that is less likely to warp and a spatial light modulator including a plurality of such light reflecting elements. Therefore, light reflection efficiency during on-control can be improved and stray light during off-control can be decreased, and consequently, it is possible to achieve an improvement in the contrast ratio.

Moreover, since the stress caused by a difference in thermal expansion rate of each layer constituting the light reflecting layer of the light reflecting element can be canceled by the stress adjusting layer, consequently, it is not necessary to increase rigidity of each layer constituting the light reflecting element, and thickening of each layer constituting the light reflecting element, which leads to deterioration of operation response of the light reflecting element, need not be performed. Furthermore, for example, in the manufacture of the light reflecting element, it is only necessary to add formation of the stress adjusting layer including the same material as the light reflecting layer, and thus it is not necessary to newly introduce equipment, and manufacturing cost can be reduced.

In addition, since the support layer is formed from above the first movable piece to above the second movable piece and the recess is formed at least in the portion of the support layer facing the space located between the first movable piece and the second movable piece, the front end of the movable piece can be easily driven (moved up and down), and the weight of the movable part can be further reduced, while high rigidity can be imparted to the light reflecting element. Consequently, it is possible to provide a light reflecting element in which the warp is further unlikely to occur, and a spatial light modulator including a plurality of such light reflecting elements. Moreover, since the support layer having the two-layer structure is formed from above the first extending portion to above the second extending portion, it is possible to impart higher rigidity to the light reflecting element. Furthermore, since the support part is provided below the light reflecting layer, it is possible to increase the area of the light reflecting layer and the fill factor of the light reflecting layer.

Example 2

Figure 9A:
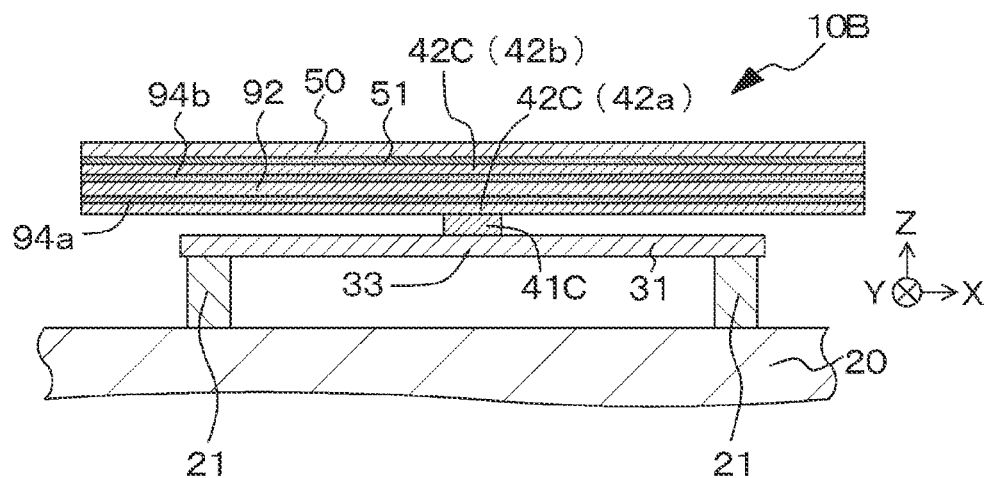
FIGS. 9A and 9B are a schematic end view similar to that taken along the arrow G-G in FIG. 3 and a similar schematic cross-sectional view taken along the arrow H-H in FIG. 3, respectively, in a light reflecting element of Example 2.
Figure 9B:
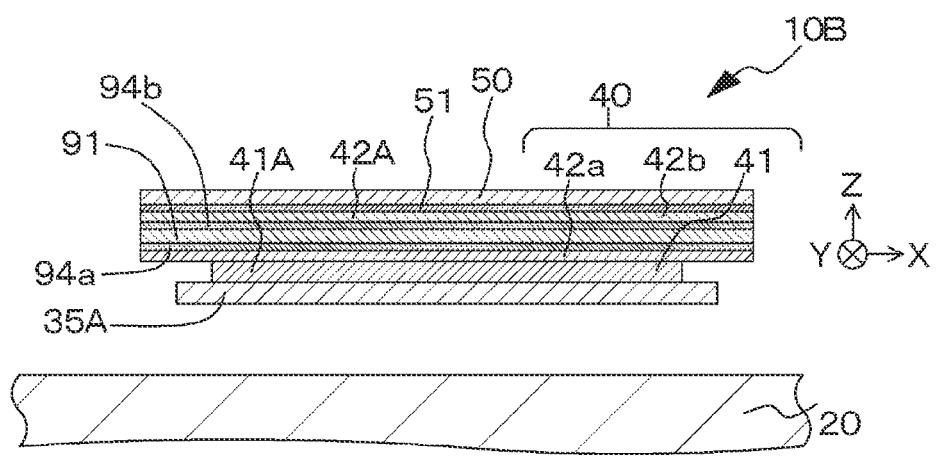
Figure 10A:
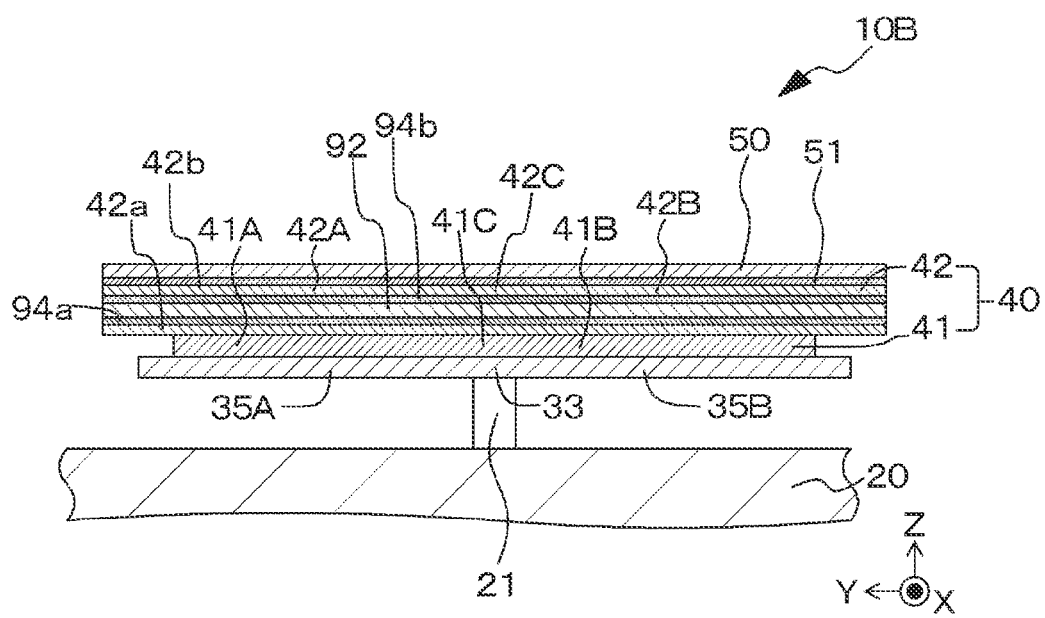
FIGS. 10A and 10B are a schematic end view similar to that taken along the arrow J-J in FIG. 3 and a similar schematic cross-sectional view taken along the arrow K-K in FIG. 3, respectively, in the light reflecting element of Example 2.
Figure 10B:
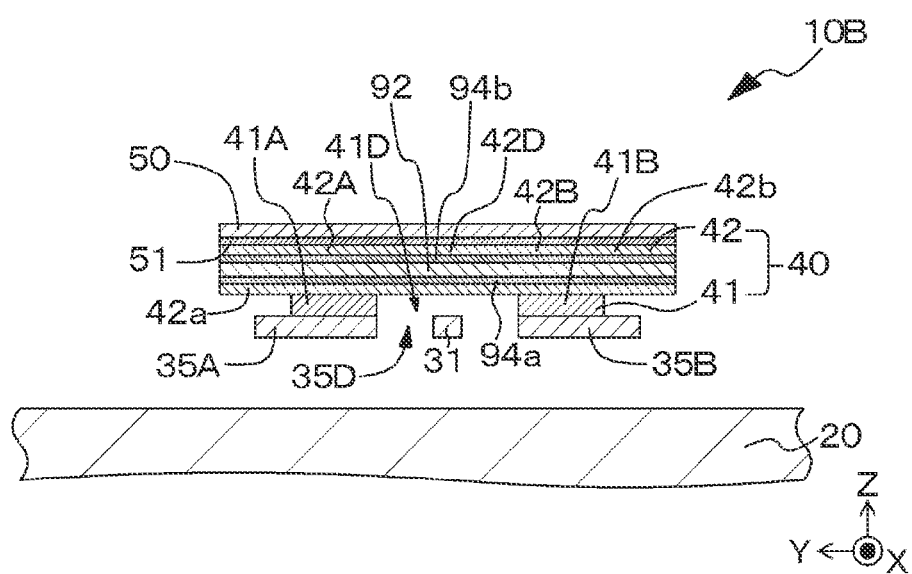

Example 2 is a modification of Example 1. In a light reflecting element of Example 2, in the light reflecting element of Example 2, a schematic end view similar to that taken along the arrow G-G in FIG. 3 and a similar schematic cross-sectional view taken along the arrow H-H in FIG. 3 are illustrated in FIGS. 9A and 9B, and a schematic end view similar to that taken along the arrow J-J in FIG. 3 and a similar schematic cross-sectional view taken along the arrow K-K in FIG. 3 are illustrated in FIGS. 10A and 10B. In a light reflecting element 10B of Example 2, a stress adjusting layer 92 is provided inside an upper support layer 42. Specifically, the upper support layer 42 has a two-layer structure of an upper support layer A (42a) and an upper support layer B (42b), the stress adjusting layer 92 is provided between the upper support layer A (42a) and the upper support layer B (42b), a first a base layer 94a is formed between the lower support layer A (42a) and the stress adjusting layer 92, and a first b base layer 94b is formed between the upper support layer B (42b) and the stress adjusting layer 92. Except for the above points, the configuration and structure of the light reflecting element of Example 2 can be similar to the configuration and structure of the light reflecting element of Example 1, and thus detailed descriptions thereof will be omitted.

Example 3

Figure 11A:
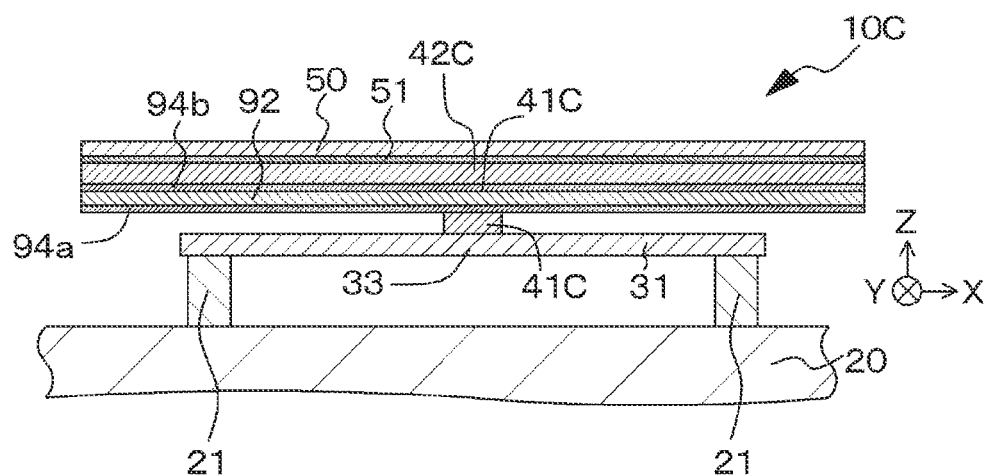
FIGS. 11A and 11B are a schematic end view similar to that taken along the arrow G-G in FIG. 3 and a similar schematic cross-sectional view taken along the arrow H-H in FIG. 3, respectively, in a light reflecting element of Example 3.
Figure 11B:
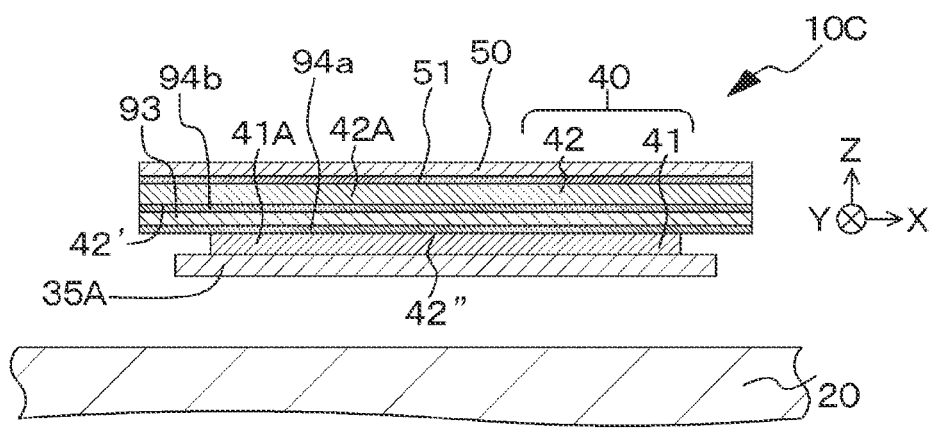
Figure 12A:
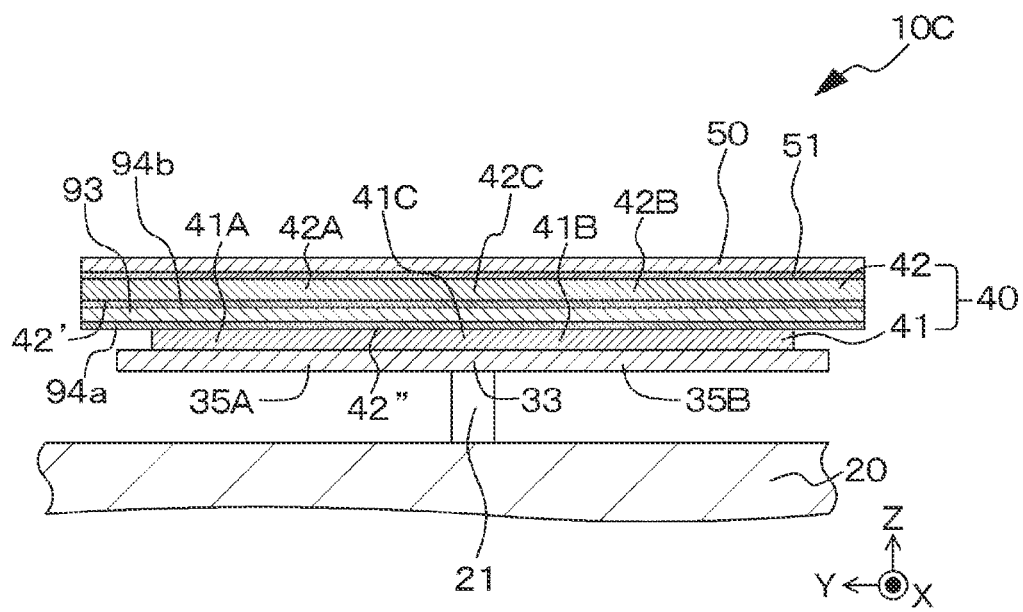
FIGS. 12A and 12B are a schematic end view similar to that taken along the arrow J-J in FIG. 3 and a similar schematic cross-sectional view taken along the arrow K-K in FIG. 3, respectively, in the light reflecting element of Example 3.
Figure 12B:
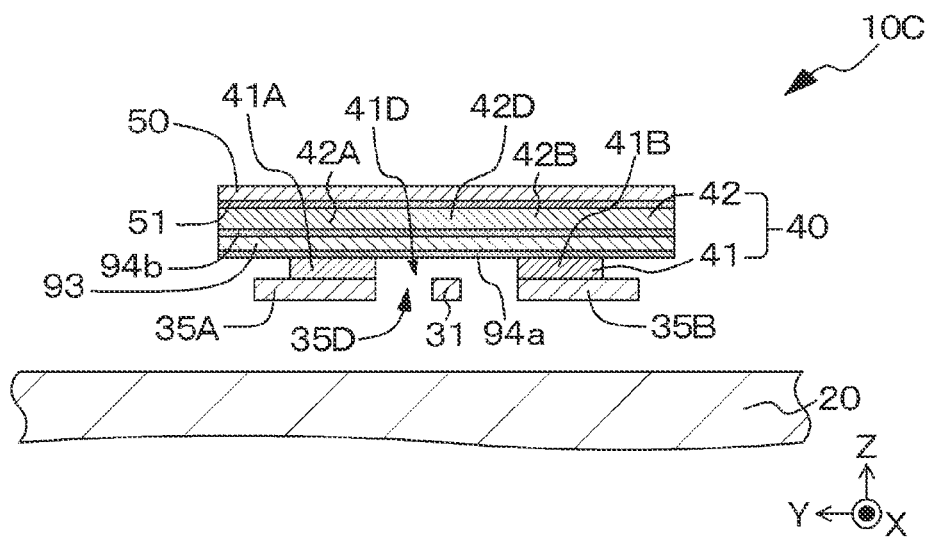

Example 3 is also a modification of Example 1. In a light reflecting element of Example 3, a schematic end view similar to that taken along the arrow G-G in FIG. 3 and a similar schematic cross-sectional view taken along the arrow H-H in FIG. 3 are illustrated in FIGS. 11A and 11B, and a schematic end view similar to that taken along the arrow J-J in FIG. 3 and a similar schematic cross-sectional view taken along the arrow K-K in FIG. 3 are illustrated in FIGS. 12A and 12B. In a light reflecting element 10C of Example 3, a stress adjusting layer 93 is provided from an exposed surface 42' on a lower surface of an upper support layer 42 facing a substrate 20 to an interface 42" between a lower support layer 41 and the upper support layer 42, a first a base layer 94a is formed between the lower support layer 41 and the stress adjusting layer 93, and a first b base layer 94b is formed between the upper support layer 42 and the stress adjusting layer 93. Except for the above points, the configuration and structure of the light reflecting element of Example 3 can be similar to the configuration and structure of the light reflecting element of Example 1, and therefore detailed descriptions thereof will be omitted.

Example 4

Figure 13:
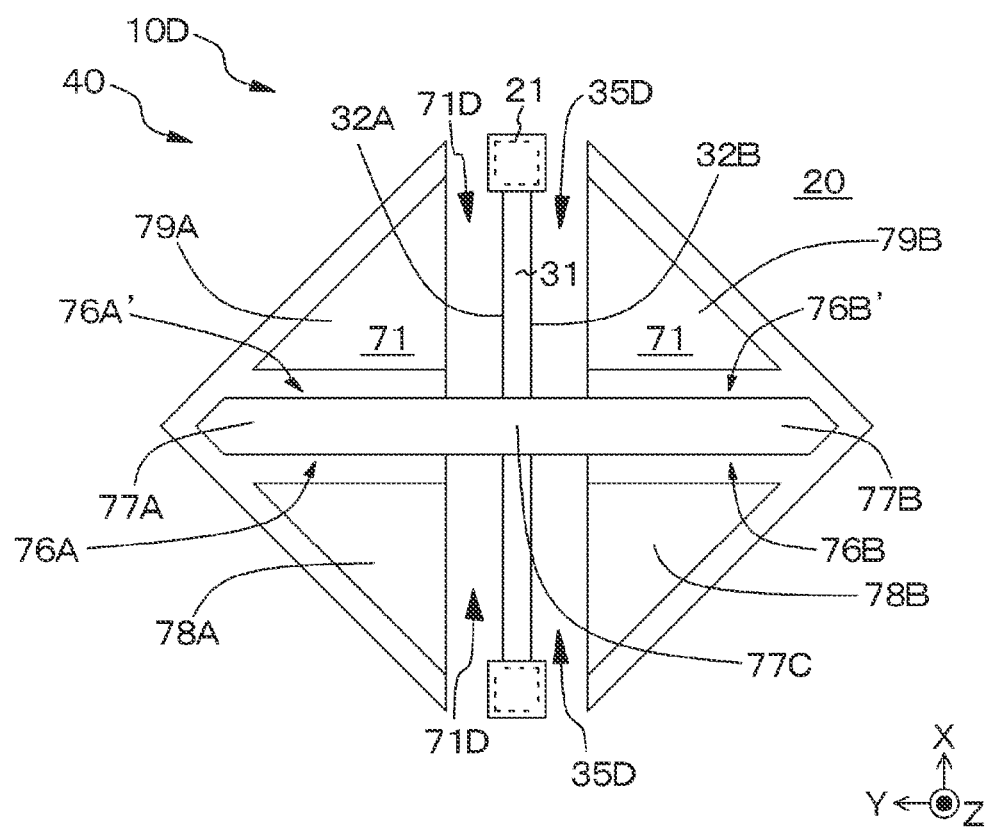
FIG. 13 is a schematic plan view of a lower support layer constituting a light reflecting element of Example 4.
Figure 14:
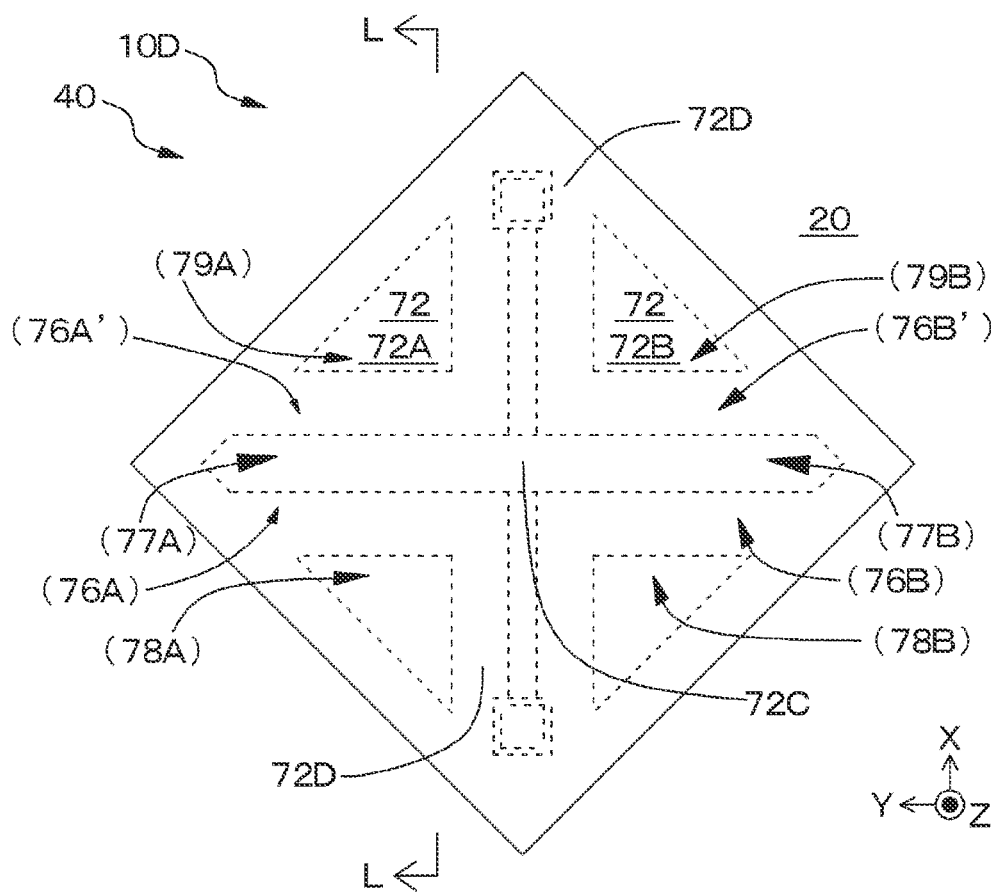
FIG. 14 is a schematic plan view of an upper support layer constituting the light reflecting element of Example 4.
Figure 15:
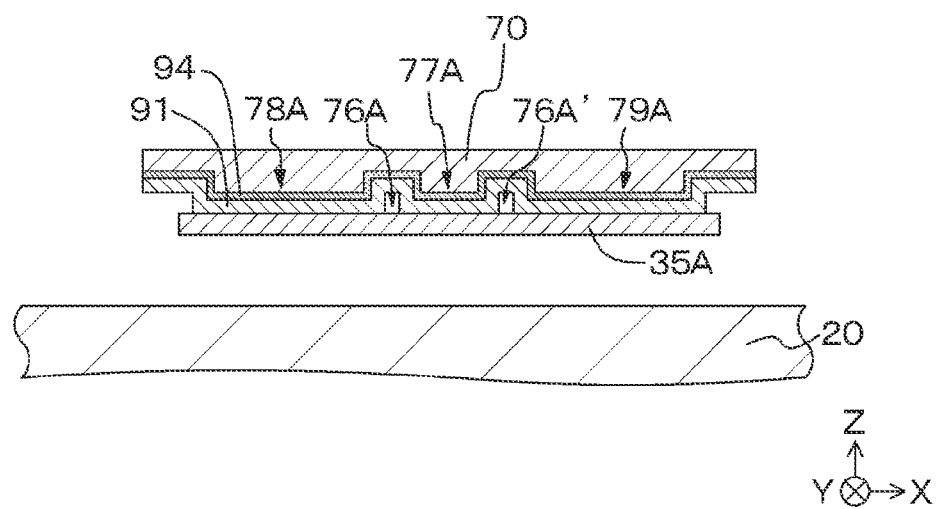
FIG. 15 is a schematic cross-sectional view taken along an arrow L-L in FIG. 14.

Example 4 is a modification of Examples 1 to 3, and relates to a light reflecting element having a third configuration. A schematic plan view of the lower support layer constituting a light reflecting element of Example 4 is illustrated in FIG. 13, a schematic plan view of an upper support layer is illustrated in FIG. 14, and a schematic cross-sectional view taken along an arrow L-L in FIG. 14 is illustrated in FIG. 15. A schematic plan view of a support part 21 and a hinge part 30 constituting the light reflecting element is the same as that in FIG. 1A. Note that in FIG. 14, an illustration of the movable piece is omitted.

In a light reflecting element 10D of Example 4,
the support layer has a two-layer structure of a lower support layer 71 and an upper support layer 72,
the lower support layer 71 includes a first A lower support layer 77A, a first B lower support layer 78A, and a first C lower support layer 79A, a second A lower support layer 77B, a second B lower support layer 78B, and a second C lower support layer 79B, and a third lower support layer 77C, the first A lower support layer 77A is formed above the first movable piece 35A,
the first B lower support layer 78A and the first C lower support layer 79A are formed above the first movable piece 35A separately from a side of the first A lower support layer 77A and across the first A lower support layer 77A,
the second A lower support layer 77B is formed above the second movable piece 35B,
the second B lower support layer 78B and the second C lower support layer 79B are formed above the second movable piece 35B separately from a side of the second A lower support layer 77B and across the second A lower support layer 77B,
the first extending portion 34A, the second extending portion 34B, and a part 33 of the torsion bar portion 31 located between the first extending portion 34A and the second extending portion 34B are located between the first A lower support layer 77A and the second A lower support layer 77B,
the third lower support layer 77C is formed above the first extending portion 34A, above the second extending portion 34B, and above the part 33 of the torsion bar portion 31 located between the first extending portion 34A and the second extending portion 34B, and
the upper support layer 72 is formed on and from the first lower support layer 77A to the second lower support layer 77B including the third lower support layer 77C.

Specifically, the upper support layer 72 is formed on the third lower support layer 77C, and is formed on the first B lower support layer 77A to the first C lower support layer 78A, and is formed on the second B lower support layer 77B to the second C lower support layer 78B, and is formed above a space (recess 71D) surrounded by the first B lower support layer 78A, the second B lower support layer 79A, and the third lower support layer 77C, and is formed above a space (recess 71D) surrounded by the first C lower support layer 79A, the second C lower support layer 79B, and the third lower support layer 77C. Areas of the upper support layer respectively facing the first movable piece 35A and the second movable piece 35B, that is, a first upper support layer occupying an area above the first movable piece 35A and a second upper support layer occupying an area above the second movable piece 35B are denoted by reference signs 72A and 72B, and an area of the upper support layer (third upper support layer) formed from the first upper support layer 72A to the second upper support layer 72B is represented by a reference sign 72C. Furthermore, an area of the upper support layer located above the recess 71D is indicated by a reference sign 72D.

There is a gap 76A in an area between the first B lower support layer 78A and the side of the first A lower support layer 77A, and there is a gap 76A' in an area between the first C lower support layer 79A and the side of the first A lower support layer 77A. There is a gap 76B in an area between the second B lower support layer 78B and the side of the second A lower support layer 77B, and there is a gap 76B' in an area between the second C lower support layer 79B and the side of the second A lower support layer 77B.

More specifically, the upper support layer 72 is formed, as illustrated in FIG. 14,
[1] on the first A lower support layer 77A,
[2] on the first B lower support layer 78A,
[3] on the first C lower support layer 79A,
[4] on the second A lower support layer 77B,
[5] on the second B lower support layer 78B, and

[6] on the second C lower support layer 79B. Furthermore, the upper support layer 72 is formed

[A] from the first A lower support layer 77A to the first B lower support layer 78A,

[B] from the first A lower support layer 77A to the first C lower support layer 79A,

[C] from the second A lower support layer 77B to the second B lower support layer 78B,

[D] from the second A lower support layer 77B to the second C lower support layer 79B,

[E] from the first A lower support layer 77A to the second A lower support layer 77B,

[F] from the first B lower support layer 78A to the second B lower support layer 78B,

[G] from the first C lower support layer 79A to the second C lower support layer 79B,

[H] from an area above the gap 76A to an area above the gap 76B, and

[I] from an area above the gap 76A' to an area above the gap 76B'.

Note that the support layer has a two-layer structure of a lower support layer 71 and an upper support layer 72, but the lower support layer 71 and the upper support layer 72 can be formed simultaneously at a time of manufacturing the light reflecting element of Example 4. Thus, it may not be possible to distinguish between the lower support layer 71 and the upper support layer 72. There may be similar cases also in other examples. In FIG. 15, the lower support layer 71 and the upper support layer 72 are collectively illustrated by the support layer 70.

Except for the above points, the configuration and structure of the light reflecting element of Example 4 can be similar to the configuration and structure of the light reflecting element described in Examples 1 to 3, and thus detailed descriptions thereof will be omitted. According to Example 4, in addition to the effects described in Example 1, since the gaps 76A, 76A', 76B, and 76B' are provided, a sacrificial layer can be easily removed during manufacturing of the light reflecting element, and it is possible to stabilize the manufacturing process and improve the manufacturing yield. Furthermore, since the mass of the support layer can be reduced, inertial force of the support layer is reduced, and operation responsiveness of the light reflecting element can be improved.

Example 5

Figure 16A:
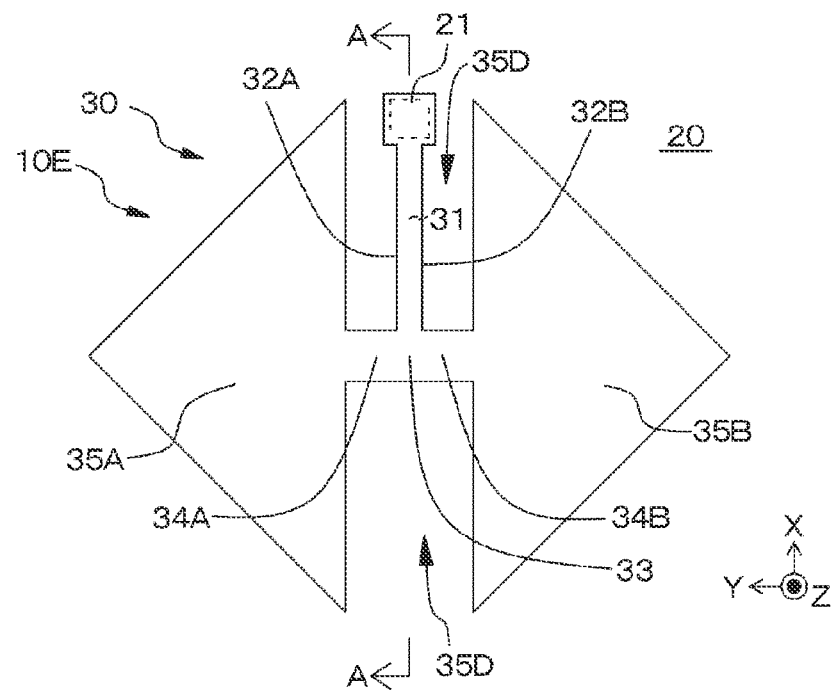
FIGS. 16A and 16B are a schematic plan view of a support part and a hinge part constituting a light reflecting element of Example 5, and a schematic plan view of a lower support layer, respectively.
Figure 16B:
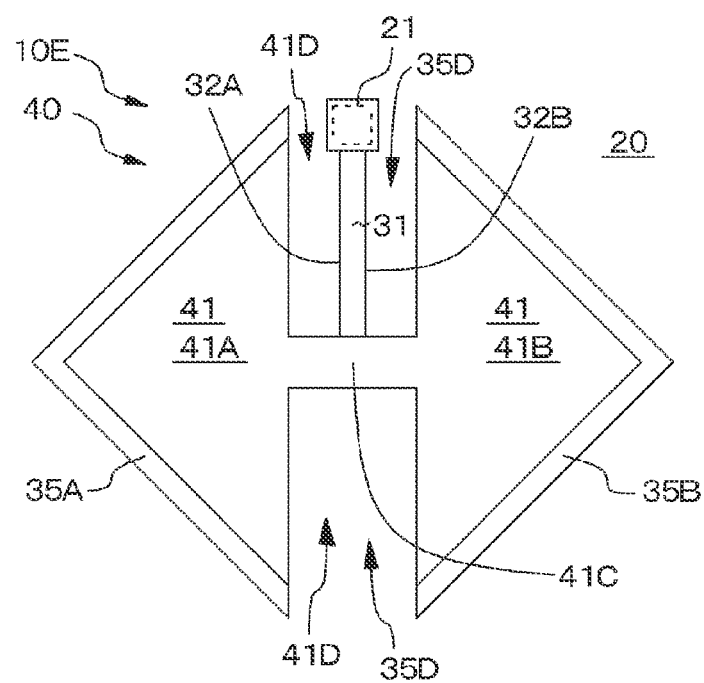
Figure 17:
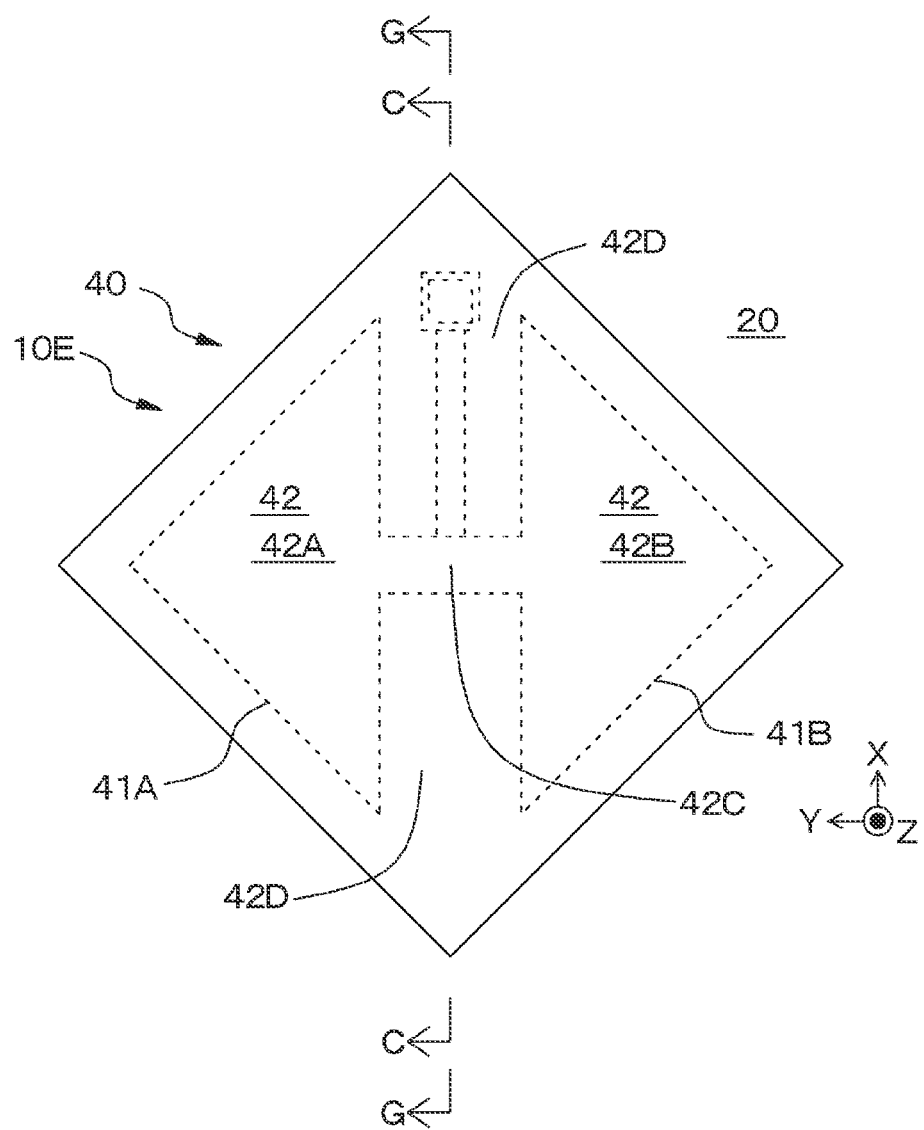
FIG. 17 is a schematic plan view of an upper support layer constituting the light reflecting element of Example 5.
Figure 18A:
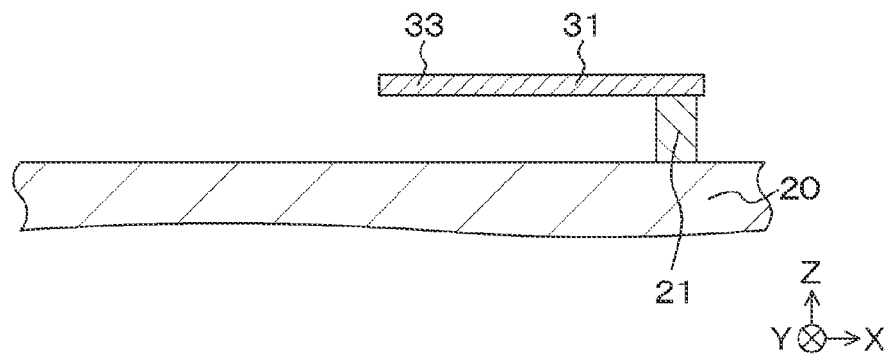
FIGS. 18A, 18B, and 18C are a schematic end view taken along an arrow A-A in FIG. 16A, a schematic end view taken along an arrow C-C in FIG. 17, and a schematic end view taken along an arrow G-G in FIG. 17, respectively.
Figure 18B:
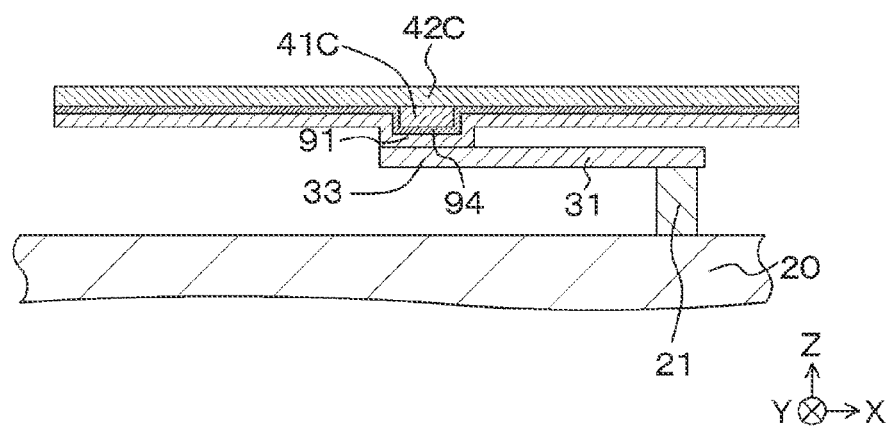
Figure 18C:
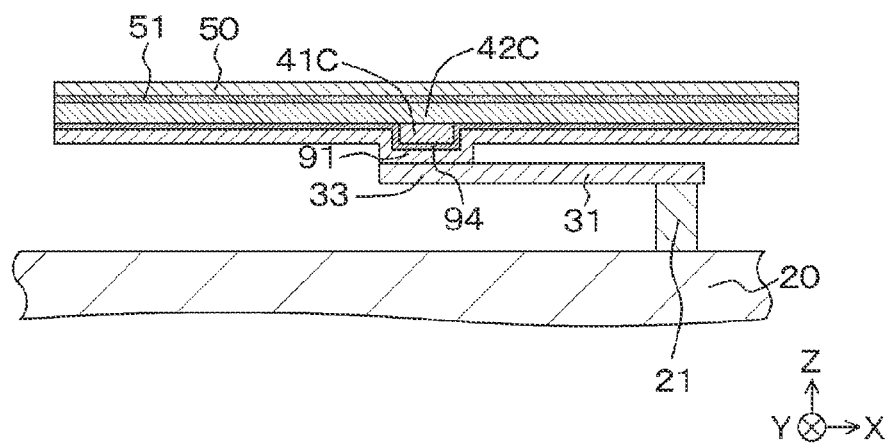
Figure 19:
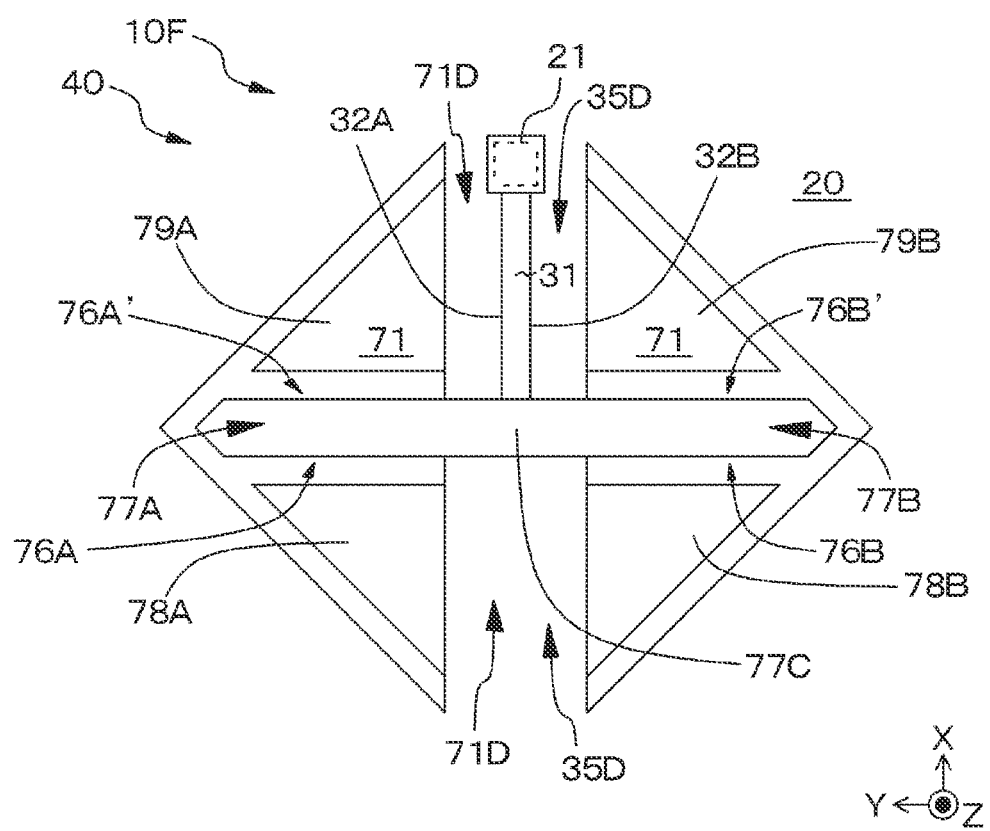
FIG. 19 is a schematic plan view of a lower support layer constituting a light reflecting element of a modification example of Example 5.
Figure 20:
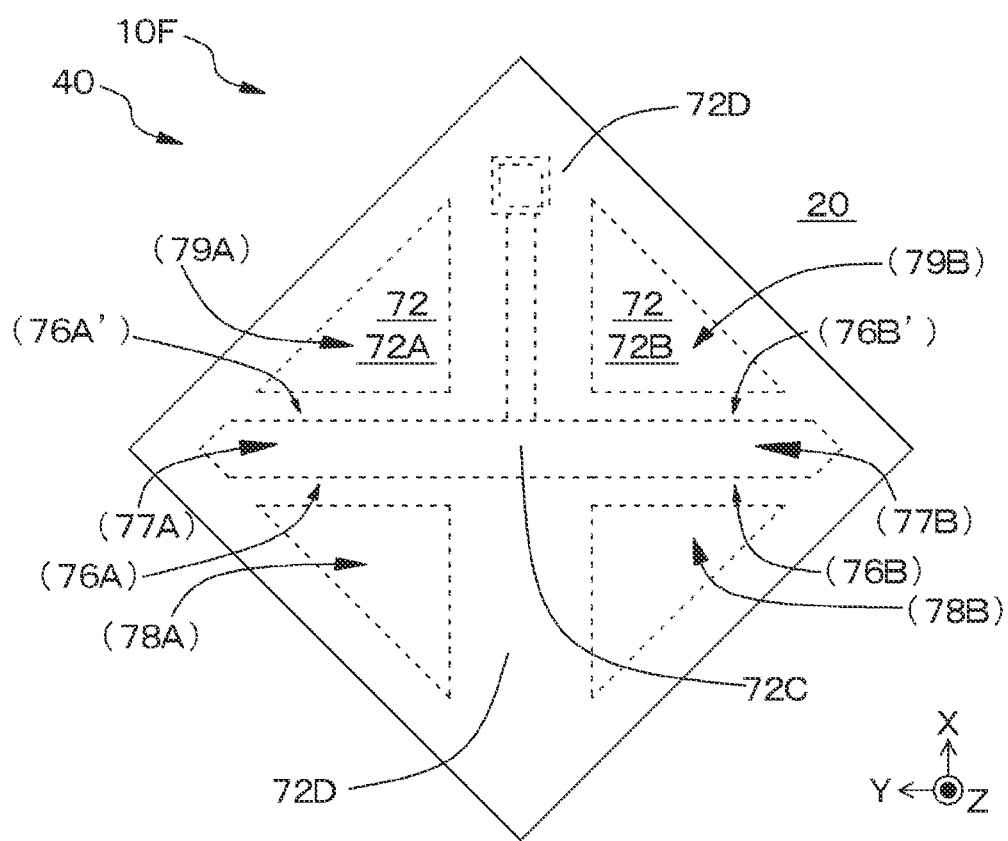
FIG. 20 is a schematic plan view of an upper support layer constituting the light reflecting element of the modification example of Example 5.

Example 5 is a modification of Examples 1 to 4. A schematic plan view of a support part 21 and a hinge part 30 constituting a light reflecting element (modification of Example 1) 10E of Example 5 is illustrated in FIG. 16A, a schematic plan view of a lower support layer is illustrated in FIG. 16B, a schematic plan view of an upper support layer constituting the light reflecting element 10E is illustrated in FIG. 17, a schematic end view taken along an arrow A-A in FIG. 16A is illustrated in FIG. 18A, a schematic end view taken along an arrow C-C in FIG. 17 is illustrated in FIG. 18B, a schematic end view taken along an arrow G-G in FIG. 17 (a schematic end view similar to that taken along the arrow G-G in FIG. 3, and a schematic end view of a state where a base layer 51 and a light reflecting layer 50 are formed above an upper support layer 42 constituting the light reflecting element 10E illustrated in FIG. 17) is illustrated in FIG. 18C. Furthermore, a schematic plan view of the lower support layer constituting a light reflecting element of a modification example 10F of Example 5 (modification of Example 4) is illustrated in FIG. 19, and a schematic plan view of an upper support layer constituting a light reflecting element 10F of a modification example of Example 5 is illustrated in FIG. 20. Note that in FIGS. 17 and 20, an illustration of the movable piece is omitted.

In the light reflecting elements 10E and 10F of Example 5, unlike Examples 1 to 4, one end of a torsion bar portion 31 is fixed to a support part 21. That is, one support part 21 is provided, and the light reflecting elements 10E and 10F of Example 5 have a cantilever structure. Except for this point, the configuration and structure of the light reflecting elements 10E and 10F of Example 5 can be similar to the configuration and structure of the light reflecting elements 10A, 10B, 10C, and 10D described in Examples 1 to 4, and thus detailed descriptions will be omitted.

Figure 24:
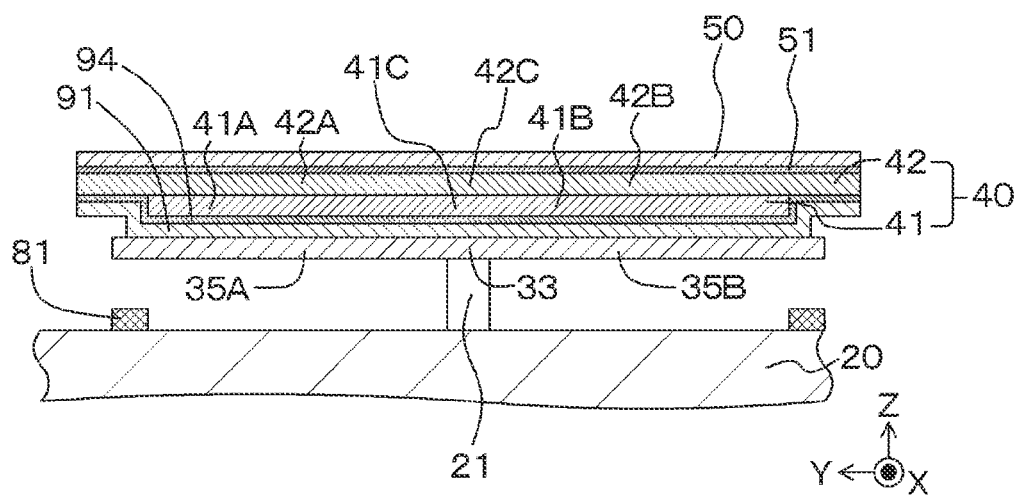
FIG. 24 is a schematic cross-sectional view similar to FIG. 8A of a lower support layer and so on constituting a light reflecting element of another modification example of Example 1.

Although the present disclosure has been described above on the basis of preferred examples, the present disclosure is not limited to these examples. The configuration, structure, shape of each part, material used, and manufacturing method of the light reflecting elements and the spatial light modulators described in the examples are examples and can be changed as appropriate. As a schematic cross-sectional view similar to FIG. 8A of the lower support layer and so on constituting the light reflecting element of another modification example of Example 1 is illustrated in FIG. 24, a stopper 81 may be provided in an area of the substrate 20 located below the front ends of the movable piece, so as to limit excessive vertical movement of the front ends of the movable pieces 35A and 35B.

Note that the present disclosure can also employ the following configurations.

[A01]<<Light Reflecting Element>>

A light reflecting element including a support part provided on a substrate, and a hinge part and a light reflecting part, in which the light reflecting part includes a support layer and a light reflecting layer formed on the support layer, the hinge part includes a torsion bar portion, a first extending portion extending from a part of one side of the torsion bar portion, a first movable piece extending from an end of the first extending portion, a second extending portion extending from a part of the other side of the torsion bar portion, and a second movable piece extending from an end of the second extending portion, an end of the torsion bar portion is fixed to the support part, the hinge part is capable of being twisted and deformed around an axis of the torsion bar portion, the support layer is formed from above the first movable piece to above the second movable piece, a recess is provided at least in a portion of the support layer facing a space located between the first movable piece and the second movable piece, and a stress adjusting layer is provided on the support layer in parallel to the light reflecting layer and separated from the light reflecting layer.

[A02] The light reflecting element according to [A01], in which the support layer has a two-layer structure of a lower support layer and an upper support layer, the lower support layer includes a first lower support layer, a second lower support layer, and a third lower support layer, the first lower support layer is formed above the first movable piece, the second lower support layer is formed above the second movable piece, the third lower support layer is formed above the first extending portion, above the second extending portion, and above a part of the torsion bar portion located between the first extending portion and the second extending portion, and the upper support layer is formed on and from the first lower support layer to the second lower support layer including the third lower support layer.

[A03] The light reflecting element according to [A02], in which the upper support layer is formed on the first lower support layer, the third lower support layer, and the second lower support layer, and above a space surrounded by the first lower support layer, the second lower support layer, and the third lower support layer.

[A04] The light reflecting element according to [A01], in which the support layer has a two-layer structure of a lower support layer and an upper support layer, the lower support layer includes a first lower support layer and a second lower support layer, the first lower support layer is formed above the first movable piece, the second lower support layer is formed above the second movable piece, and the lower support layer is not formed on the first extending portion, the second extending portion, and a part of the torsion bar portion located between the first extending portion and the second extending portion.

[A05] The light reflecting element according to [A04], in which a space existing above the first extending portion, the second extending portion, and the part of the torsion bar portion located between the first extending portion and the second extending portion communicates with the recess.

[A06] The light reflecting element according to [A01], in which the support layer has a two-layer structure of a lower support layer and an upper support layer, the lower support layer includes a first A lower support layer, a first B lower support layer, and a first C lower support layer, a second A lower support layer, a second B lower support layer, and a second C lower support layer, and a third lower support layer, the first A lower support layer is formed above the first movable piece, the first B lower support layer and the first C lower support layer are formed above the first movable piece separately from a side of the first A lower support layer and across the first A lower support layer, the second A lower support layer is formed above the second movable piece, the second B lower support layer and the second C lower support layer are formed above the second movable piece separately from a side of the second A lower support layer and across the second A lower support layer, the first extending portion, the second extending portion, and a part of the torsion bar portion located between the first extending portion and the second extending portion are located between the first A lower support layer and the second A lower support layer, the third lower support layer is formed above the first extending portion, above the second extending portion, and above the part of the torsion bar portion located between the first extending portion and the second extending portion, and the upper support layer is formed on and from the first lower support layer to the second lower support layer including the third lower support layer.

[A07] The light reflecting element according to [A06], in which the upper support layer is formed on the third lower support layer, and is formed on the first B lower support layer to the first C lower support layer, and is formed on the second B lower support layer to the second C lower support layer, and is formed above a space surrounded by the first B lower support layer, the second B lower support layer, and the third lower support layer, and is formed above a space surrounded by the first C lower support layer, the second C lower support layer, and the third lower support layer.

[A08] The light reflecting element according to any one of [A01] to [A07], in which the recess is provided on a surface of a side of the substrate of the support layer.

[A09] The light reflecting element according to any one of [A01] to [A08], in which the stress adjusting layer is provided from an exposed surface of a lower surface of an upper support layer facing the substrate to a lower surface of a lower support layer facing the substrate.

[A10] The light reflecting element according to any one of [A01] to [A08], in which the stress adjusting layer is provided from an exposed surface of a lower surface of an upper support layer facing the substrate to an interface between a lower support layer and the upper support layer.

[A11] The light reflecting element according to any one of [A01] to [A08], in which the stress adjusting layer is provided inside an upper support layer.

[A12] The light reflecting element according to any one of [A01] to [A11], in which a material forming at least a part of the light reflecting layer and a material forming at least a part of the stress adjusting layer are same.

[A13] The light reflecting element according to [A12], in which a material forming the light reflecting layer and a material forming the stress adjusting layer are same.

[A14] The light reflecting element according to any one of [A01] to [A13], in which a thickness of the light reflecting layer and a thickness of the stress adjusting layer are same.

[A15] The light reflecting element according to any one of [A01] to [A14], in which a configuration of the light reflecting layer and a configuration of the stress adjusting layer are symmetrical with respect to a layer existing between the light reflecting layer and the stress adjusting layer.

[A16] The light reflecting element according to any one of [A01] to [A15], in which, when a surface of the substrate is an XY plane, and when a stress at a maximum temperature specification value is $\sigma_{11}$ and a stress at a minimum temperature specification value is $\sigma_{12}$ among stresses generated in a plane parallel to the XY plane of the light reflecting layer, and a stress at a maximum temperature specification value is $\sigma_{21}$ and a stress at a minimum temperature specification value is $\sigma_{22}$ among stresses generated in a plane parallel to the XY plane of the stress adjusting layer, a sign of $\sigma_{11}$ and a sign of $\sigma_{21}$ are same, and a sign of $\sigma_{12}$ and a sign of $\sigma_{22}$ are same.

[A17] The light reflecting element according to any one of [A01] to [A16], in which both ends of the torsion bar portion are fixed to the support part, or one end of the torsion bar portion is fixed to the support part.

[A18] The light reflecting element according to any one of [A01] to [A17], in which the first extending portion and the second extending portion are arranged line-symmetrically with the axis of the torsion bar portion as an axis of symmetry, and the first movable piece and the second movable piece are arranged line-symmetrically with the axis of the torsion bar portion as an axis of symmetry.

[A19] The light reflecting element according to any one of [A01] to [A18], in which the light reflecting part covers the support part.

[A20] The light reflecting element according to any one of [A01] to [A19], in which an electrode for twisting and deforming the hinge part around the axis of the torsion bar portion is provided on a portion of the substrate facing each of the first movable piece and the second movable piece.

[A21] The light reflecting element according to any one of [A01] to [A20], in which a stopper is provided in an area of the substrate located below a front end of the movable piece.

[B01]<<Spatial Light Modulator>>

A spatial light modulator including light reflecting elements arranged in an array,
  in which each of the light reflecting elements include a support part provided on a substrate, and a hinge part and a light reflecting part,
  the light reflecting part includes a support layer and a light reflecting layer formed on the support layer,
  the hinge part includes a torsion bar portion, a first extending portion extending from a part of one side of the torsion bar portion, a first movable piece extending from an end of the first extending portion, a second extending portion extending from a part of the other side of the torsion bar portion, and a second movable piece extending from an end of the second extending portion,
  an end of the torsion bar portion is fixed to the support part,
  the hinge part is capable of being twisted and deformed around an axis of the torsion bar portion,
  the support layer is formed from above the first movable piece to above the second movable piece,
  a recess is provided at least in a portion of the support layer facing a space located between the first movable piece and the second movable piece, and
  a stress adjusting layer is provided on the support layer in parallel to the light reflecting layer and separated from the light reflecting layer.

[B02] The spatial light modulator according to [B01], in which in each of the light reflecting elements,
  the support layer has a two-layer structure of a lower support layer and an upper support layer,
  the lower support layer includes a first lower support layer, a second lower support layer, and a third lower support layer,
  the first lower support layer is formed above the first movable piece,
  the second lower support layer is formed above the second movable piece,
  the third lower support layer is formed above the first extending portion, above the second extending portion, and above a part of the torsion bar portion located between the first extending portion and the second extending portion, and
  the upper support layer is formed on and from the first lower support layer to the second lower support layer including the third lower support layer.

[B03] The spatial light modulator according to [B02], in which in each of the light reflecting elements, the upper support layer is formed on the first lower support layer, the third lower support layer, and the second lower support layer, and above a space surrounded by the first lower support layer, the second lower support layer, and the third lower support layer.

[B04] The spatial light modulator according to [B01], in which in each of the light reflecting elements,
  the support layer has a two-layer structure of a lower support layer and an upper support layer,
  the lower support layer includes a first lower support layer and a second lower support layer,
  the first lower support layer is formed above the first movable piece,
  the second lower support layer is formed above the second movable piece, and
  the lower support layer is not formed on the first extending portion, the second extending portion, and a part of the torsion bar portion located between the first extending portion and the second extending portion.

[B05] The spatial light modulator according to [B04], in which in each of the light reflecting elements, a space existing above the first extending portion, the second extending portion, and the part of the torsion bar portion located between the first extending portion and the second extending portion communicates with the recess.

[B06] The spatial light modulator according to [B01], in which in each of the light reflecting elements,
  the support layer has a two-layer structure of a lower support layer and an upper support layer,
  the lower support layer includes a first A lower support layer, a first B lower support layer, and a first C lower support layer, a second A lower support layer, a second B lower support layer, and a second C lower support layer, and a third lower support layer,
  the first A lower support layer is formed above the first movable piece,
  the first B lower support layer and the first C lower support layer are formed above the first movable piece separately from a side of the first A lower support layer and across the first A lower support layer,
  the second A lower support layer is formed above the second movable piece,
  the second B lower support layer and the second C lower support layer are formed above the second movable piece separately from a side of the second A lower support layer and across the second A lower support layer,
  the first extending portion, the second extending portion, and a part of the torsion bar portion located between the first extending portion and the second extending portion are located between the first A lower support layer and the second A lower support layer,
  the third lower support layer is formed above the first extending portion, above the second extending portion, and above the part of the torsion bar portion located between the first extending portion and the second extending portion, and
  the upper support layer is formed on and from the first lower support layer to the second lower support layer including the third lower support layer.

[B07] The spatial light modulator according to [B06], in which in each of the light reflecting elements, the upper support layer is formed on the third lower support layer, and is formed on the first B lower support layer to the first C lower support layer, and is formed on the second B lower support layer to the second C lower support layer, and is formed above a space surrounded by the first B lower support layer, the second B lower support layer, and the third lower support layer, and is formed above a space surrounded by the first C lower support layer, the second C lower support layer, and the third lower support layer.

[B08] The spatial light modulator according to any one of [B01] to [B07], in which in each of the light reflecting elements, the recess is provided on a surface of a side of the substrate of the support layer.

[B09] The spatial light modulator according to any one of [B01] to [B08], in which in each of the light reflecting elements, the stress adjusting layer is provided from an exposed surface of a lower surface of an upper support layer facing the substrate to a lower surface of a lower support layer facing the substrate.

[B10] The spatial light modulator according to any one of [B01] to [B08], in which in each of the light reflecting elements, the stress adjusting layer is provided from an exposed surface of a lower surface of an upper support layer facing the substrate to an interface between a lower support layer and the upper support layer.

[B11] The spatial light modulator according to any one of [B01] to [B08], in which in each of the light reflecting elements, the stress adjusting layer is provided inside an upper support layer.

[B12] The spatial light modulator according to any one of [B01] to [B11], in which in each of the light reflecting elements, a material forming at least a part of the light reflecting layer and a material forming at least a part of the stress adjusting layer are same.

[B13] The spatial light modulator according to [B12], in which in each of the light reflecting elements, a material forming the light reflecting layer and a material forming the stress adjusting layer are same.

[B14] The spatial light modulator according to any one of [B01] to [B13], in which in each of the light reflecting elements, a thickness of the light reflecting layer and a thickness of the stress adjusting layer are same.

[B15] The spatial light modulator according to any one of [B01] to [B14], in which in each of the light reflecting elements, a configuration of the light reflecting layer and a configuration of the stress adjusting layer are symmetrical with respect to a layer existing between the light reflecting layer and the stress adjusting layer.

[B16] The spatial light modulator according to any one of [B01] to [B15], in which in each of the light reflecting elements, when a surface of the substrate is an XY plane, and when a stress at a maximum temperature specification value is $\sigma_{11}$ and a stress at a minimum temperature specification value is $\sigma_{12}$ among stresses generated in a plane parallel to the XY plane of the light reflecting layer, and a stress at a maximum temperature specification value is $\sigma_{21}$ and a stress at a minimum temperature specification value is $\sigma_{22}$ among stresses generated in a plane parallel to the XY plane of the stress adjusting layer, a sign of $\sigma_{11}$ and a sign of $\sigma_{21}$ are same, and a sign of $\sigma_{12}$ and a sign of $\sigma_{22}$ are same.

[B17] The spatial light modulator according to any one of [B01] to [B16], in which in each of the light reflecting elements, both ends of the torsion bar portion are fixed to the support part, or one end of the torsion bar portion is fixed to the support part.

[B18] The spatial light modulator according to any one of [B01] to [B17], in which in each of the light reflecting elements,
the first extending portion and the second extending portion are arranged line-symmetrically with the axis of the torsion bar portion as an axis of symmetry, and
the first movable piece and the second movable piece are arranged line-symmetrically with the axis of the torsion bar portion as an axis of symmetry.

[B19] The spatial light modulator according to any one of [B01] to [B18], in which in each of the light reflecting elements, the light reflecting part covers the support part.

[B20] The spatial light modulator according to any one of [B01] to [B19], in which in each of the light reflecting elements, an electrode for twisting and deforming the hinge part around the axis of the torsion bar portion is provided on a portion of the substrate facing each of the first movable piece and the second movable piece.

[B21] The spatial light modulator according to any one of [B01] to [B20], in which in each of the light reflecting elements, a stopper is provided in an area of the substrate located below a front end of the movable piece.

REFERENCE SIGNS LIST 10A, 10B, 10C, 10D, 10E, 10F Light reflecting element
11 Spatial light modulator
12 Light source
13 Optical system (lens)
14 Screen
20 Substrate
21 Support part
30 Hinge part
31 Torsion bar portion
32A One side of part of torsion bar portion
32B Other side of part of torsion bar portion
33 Part of torsion bar portion located between first extending portion and second extending portion
34A First extending portion
34B Second extending portion
35A First movable piece
35B Second movable piece
35D, 35E Space
40 Light reflecting part
70 Support layer
41, 71 Lower support layer
41A First lower support layer
41B Second lower support layer
41C Third lower support layer
41D Recess (space)
41E Second recess
71D Recess (space)
42, 72 Upper support layer
42A, 72A First upper support layer
42B, 72B Second upper support layer
42C, 72C Third upper support layer
42D, 72D Areas of upper support layer located above recess 41D
50 Light reflecting layer
51 Second base layer (second intermediate layer)
70 Support layer
76A Gap existing in area between first B lower support layer and side of first A lower support layer
76A' Gap existing in area between first C lower support layer and side of first A lower support layer
76B Gap existing in area between second B lower support layer and side of second A lower support layer
76B' Gap existing in area between second C lower support layer and side of second A lower support layer
77A First A lower support layer
78B First B lower support layer
79C First C lower support layer
77B Second A lower support layer
78B Second B lower support layer
79C Second C lower support layer
80 Electrode 81 Stopper
91, 92, 93 Stress adjusting layer
94, 94a, 94b First base layer (first intermediate layer)

The invention claimed is:
1. A light reflecting element, comprising:
a substrate;
a hinge part;
a support part on the substrate;
a light reflecting part, wherein
the light reflecting part includes a support layer and a light reflecting layer,
the light reflecting layer is on the support layer,
the hinge part includes a torsion bar portion, a first extending portion extendable from a first part of a first side of the torsion bar portion, a first movable piece extendable from an end of the first extending portion, a second extending portion extendable from a second part of a second side of the torsion bar portion, and a second movable piece extendable from an end of the second extending portion,
an end of the torsion bar portion is fixed to the support part,
the hinge part is configured to twist and deform around an axis of the torsion bar portion,
the support layer is from above the first movable piece to above the second movable piece,
a recess is at least in a first portion of the support layer,
the recess is on a first surface of a third side of the substrate,
the first surface is opposite to a second surface of the substrate,
the light reflecting layer is on the second surface of the substrate,
the first portion of the support layer faces a first space between the first movable piece and the second movable piece,
a stress adjusting layer is on the support layer,
the stress adjusting layer is in parallel to the light reflecting layer, and
the stress adjusting layer is separated from the light reflecting layer.
2. The light reflecting element according to claim 1, wherein
the support layer has a two-layer structure comprising a lower support layer and an upper support layer,
the lower support layer includes a first lower support layer, a second lower support layer, and a third lower support layer,
the first lower support layer is above the first movable piece,
the second lower support layer is above the second movable piece,
the third lower support layer is above the first extending portion, above the second extending portion, and above a third part of the torsion bar portion between the first extending portion and the second extending portion, and
the upper support layer is on and from the first lower support layer to the second lower support layer including the third lower support layer.
3. The light reflecting element according to claim 2, wherein
the upper support layer is on the first lower support layer, the third lower support layer, and the second lower support layer, and
the upper support layer is above a second space surrounded by the first lower support layer, the second lower support layer, and the third lower support layer.
4. The light reflecting element according to claim 1, wherein
the support layer is a two-layer structure comprising a lower support layer and an upper support layer,
the lower support layer includes a first lower support layer and a second lower support layer,
the first lower support layer is above the first movable piece,
the second lower support layer is above the second movable piece, and
a third part of the torsion bar portion is between the first extending portion and the second extending portion.
5. The light reflecting element according to claim 4, wherein
a second space exists above the first extending portion, the second extending portion, and the third part of the torsion bar portion, and
the second space joins the recess.
6. The light reflecting element according to claim 1, wherein
the support layer is a two-layer structure comprising a lower support layer and an upper support layer,
the lower support layer includes a first A lower support layer, a first B lower support layer, a first C lower support layer, a second A lower support layer, a second B lower support layer, a second C lower support layer, and a third lower support layer,
the first A lower support layer is above the first movable piece,
the first B lower support layer and the first C lower support layer are above the first movable piece,
the first B lower support layer and the first C lower support layer are separated by,
the second A lower support layer is above the second movable piece,
the second B lower support layer and the second C lower support layer are above the second movable piece,
the second B lower support layer and the second C lower support layer are separated by the second A lower support layer,
the first extending portion, the second extending portion, and a third part of the torsion bar portion are between the first A lower support layer and the second A lower support layer,
the third part of the torsion bar portion is between the first extending portion and the second extending portion,
the third lower support layer is above the first extending portion, above the second extending portion, and above the third part of the torsion bar portion, and
the upper support layer is on and from the first lower support layer to the second lower support layer and the third lower support layer.
7. The light reflecting element according to claim 6, wherein
the upper support layer is on the third lower support layer,
the upper support layer extends over the first B lower support layer to the first C lower support layer,
the upper support layer extends over the second B lower support layer to the second C lower support layer,
the upper support layer is above a second space surrounded by the first B lower support layer, the second B lower support layer, and the third lower support layer, and the upper support layer is above a third space surrounded by the first C lower support layer, the second C lower support layer, and the third lower support layer.

8. The light reflecting element according to claim 1, wherein
the stress adjusting layer is from an exposed surface of a first lower surface of an upper support layer to a second lower surface of a lower support layer, and
the upper support layer and the lower support layer face the substrate.

9. The light reflecting element according to claim 1, wherein
the stress adjusting layer is from an exposed surface of a lower surface of an upper support layer to an interface,
the interface is between a lower support layer and the upper support layer, and
the upper support layer faces the substrate.

10. The light reflecting element according to claim 1, wherein the stress adjusting layer is inside an upper support layer.

11. The light reflecting element according to claim 1, wherein a first material of at least a third part of the light reflecting layer and a second material of at least a fourth part of the stress adjusting layer are same.

12. The light reflecting element according to claim 1, wherein a first thickness of the light reflecting layer and a second thickness of the stress adjusting layer are same.

13. The light reflecting element according to claim 1, wherein a first configuration of the light reflecting layer and a second configuration of the stress adjusting layer are symmetrical with respect to a layer that exists between the light reflecting layer and the stress adjusting layer.

14. The light reflecting element according to claim 1, wherein
a sign of $\sigma_{11}$ and a sign of $\sigma_{21}$ are same, and a sign of $\sigma_{12}$ and a sign of $\sigma_{22}$ are same based on:
the first surface and the second surface of the substrate is an XY plane,
a first stress at a maximum value of temperature specification value is $\sigma_{11}$ and a second stress at a minimum value of temperature specification value is $\sigma_{12}$ among a first plurality of stresses generated in a first plane parallel to the XY plane of the light reflecting layer, and
a third stress at a maximum value of temperature specification value is $\sigma_{21}$ and a fourth stress at a minimum value of temperature specification value is $\sigma_{22}$ among a second plurality of stresses generated in a second plane parallel to the XY plane of the stress adjusting layer.

15. The light reflecting element according to claim 1, wherein at least one of two ends of the torsion bar portion are fixed to the support part.

16. The light reflecting element according to claim 1, wherein
the first extending portion and the second extending portion are symmetrical in line with the axis of the torsion bar portion as an axis of symmetry, and
the first movable piece and the second movable piece are symmetrical in line with the axis of the torsion bar portion as the axis of symmetry.

17. The light reflecting element according to claim 1, wherein the light reflecting part is configured to cover the support part.

18. The light reflecting element according to claim 1, wherein
an electrode is configured to twist and deform the hinge part around the axis of the torsion bar portion,
the electrode is on a second portion of the substrate, and
the electrode faces each of the first movable piece and the second movable piece.

19. The light reflecting element according to claim 1, wherein a stopper is on an area of the substrate below a front end of the first movable piece and the second movable piece.

20. A spatial light modulator, comprising:
a plurality of light reflecting elements arranged in an array, wherein
each of the plurality of light reflecting elements comprises:
a substrate,
a hinge part,
a support part on the substrate, and
a light reflecting part,
the light reflecting part includes a support layer and a light reflecting layer,
the light reflecting layer is on the support layer,
the hinge part includes a torsion bar portion, a first extending portion extendable from a first part of a first side of the torsion bar portion, a first movable piece extendable from an end of the first extending portion, a second extending portion extendable from a second part of a second side of the torsion bar portion, and a second movable piece extendable from an end of the second extending portion,
an end of the torsion bar portion is fixed to the support part,
the hinge part is configured to twist and deform around an axis of the torsion bar portion,
the support layer is from above the first movable piece to above the second movable piece,
a recess is at least in a portion of the support layer,
the recess is on a first surface of a third side of the substrate,
the first surface is opposite to a second surface of the substrate,
the light reflecting layer is on the second surface of the substrate,
the portion of the support layer faces a space between the first movable piece and the second movable piece,
a stress adjusting layer is on the support layer,
the stress adjusting layer is in parallel to the light reflecting layer, and
the stress adjusting layer is separated from the light reflecting layer.

* * * * *